(12) United States Patent
Lee et al.

(10) Patent No.: US 12,412,822 B2
(45) Date of Patent: Sep. 9, 2025

(54) SEMICONDUCTOR CHIP AND SEMICONDUCTOR PACKAGE INCLUDING THE SAME

(71) Applicant: SAMSUNG ELECTRO-MECHANICS CO., LTD., Suwon-si (KR)

(72) Inventors: Yun Tae Lee, Suwon-si (KR); Jin Won Lee, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 624 days.

(21) Appl. No.: 17/743,740

(22) Filed: May 13, 2022

(65) Prior Publication Data

US 2023/0215793 A1 Jul. 6, 2023

(30) Foreign Application Priority Data

Dec. 31, 2021 (KR) .......................... 10-2021-0194291
Mar. 3, 2022 (KR) .......................... 10-2022-0027234

(51) Int. Cl.
*H01L 23/498* (2006.01)
*H01L 23/00* (2006.01)
(Continued)

(52) U.S. Cl.
CPC ...... *H01L 23/49833* (2013.01); *H01L 23/145* (2013.01); *H01L 23/49816* (2013.01);
(Continued)

(58) Field of Classification Search
CPC ............. H01L 23/49833; H01L 23/145; H01L 23/49816; H01L 23/49822;
(Continued)

(56) References Cited

U.S. PATENT DOCUMENTS 11,329,047 B2 * 5/2022 Wang ................. H10D 86/0212
2008/0277765 A1 * 11/2008 Lane ....................... H01L 21/78
257/E21.546
(Continued)

FOREIGN PATENT DOCUMENTS

CN 112530882 A * 3/2021 ....... H01L 21/02516
CN 112530906 A * 3/2021 ........... H01L 23/495
(Continued)

OTHER PUBLICATIONS

KR-20220016689-A, You Se Ho et al, Google Machine Language Translation (Year: 2024).*

*Primary Examiner* — Michael Lebentritt
(74) *Attorney, Agent, or Firm* — Morgan Lewis & Bockius LLP

(57) ABSTRACT

A semiconductor package includes: a semiconductor chip including a front end of line (FEOL) layer and a first back end of line (BEOL) layer disposed on the FEOL layer; and a printed circuit board including a wiring layer and a second BEOL layer disposed on the wiring layer, wherein the semiconductor chip is mounted on the printed circuit board so that the first and second BEOL layers are connected to each other while facing each other, and the second BEOL layer includes a wiring for power transmission.

23 Claims, 15 Drawing Sheets

(51) Int. Cl.
*H01L 23/14* (2006.01)
*H01L 23/522* (2006.01)
*H01L 23/528* (2006.01)

(52) U.S. Cl.
CPC .. *H01L 23/49822* (2013.01); *H01L 23/49838* (2013.01); *H01L 23/5226* (2013.01); *H01L 23/5283* (2013.01); *H01L 23/5286* (2013.01); *H01L 24/16* (2013.01); *H01L 2224/16013* (2013.01); *H01L 2224/16227* (2013.01); *H01L 2224/16237* (2013.01)

(58) Field of Classification Search
CPC ........... H01L 23/49838; H01L 23/5226; H01L 23/5283; H01L 23/5286; H01L 24/16; H01L 2224/16013; H01L 2224/16227; H01L 2224/16237
See application file for complete search history.

(56) References Cited

U.S. PATENT DOCUMENTS

| | | | | |
|---|---|---|---|---|
| 2015/0333004 | A1* | 11/2015 | Jomaa | H01L 23/5226 257/774 |
| 2017/0338206 | A1* | 11/2017 | Seo | H01L 23/53238 |
| 2018/0047756 | A1* | 2/2018 | Yoshida | H01L 25/0657 |
| 2018/0102470 | A1* | 4/2018 | Das | H01P 7/086 |
| 2019/0319626 | A1* | 10/2019 | Dabral | G06F 13/4022 |
| 2020/0020610 | A1* | 1/2020 | Lim | H01L 24/02 |
| 2021/0028061 | A1 | 1/2021 | Farooq et al. | |
| 2021/0050339 | A1 | 2/2021 | Yoo et al. | |
| 2022/0165669 | A1* | 5/2022 | Yu | H01L 24/80 |
| 2022/0199517 | A1* | 6/2022 | Dabral | H01L 23/522 |
| 2022/0317179 | A1* | 10/2022 | Kwon | G01R 31/2856 |
| 2022/0359466 | A1* | 11/2022 | Kim | H01L 25/50 |
| 2023/0069490 | A1* | 3/2023 | Lee | H01L 23/49838 |
| 2023/0085890 | A1* | 3/2023 | Dabral | H01L 24/18 257/621 |
| 2024/0128239 | A1* | 4/2024 | Song | H01L 24/16 |
| 2024/0213109 | A1* | 6/2024 | Ko | H01L 23/3178 |
| 2024/0222274 | A1* | 7/2024 | Akkinepally | H01L 24/16 |

FOREIGN PATENT DOCUMENTS

| | | | | | |
|---|---|---|---|---|---|
| CN | 117434317 | A | * | 1/2024 | ......... G01R 1/06783 |
| CN | 117729779 | A | * | 3/2024 | ......... H01L 23/3107 |
| CN | 118299373 | A | * | 7/2024 | ........ H01L 21/76898 |
| KR | 20130037550 | A | * | 4/2013 | |
| KR | 20220016689 | A | * | 2/2022 | |
| TW | 202201740 | A | * | 1/2022 | ............... G11C 5/06 |

* cited by examiner

SEMICONDUCTOR CHIP AND SEMICONDUCTOR PACKAGE INCLUDING THE SAME

CROSS-REFERENCE TO RELATED APPLICATION(S)

This application claims benefit of priority to Korean Patent Applications Nos. 10-2021-0194291 filed on Dec. 31, 2021 and 10-2022-0027234 filed on Mar. 3, 2022 in the Korean Intellectual Property Office, the disclosures of which are incorporated herein by reference in its entirety.

TECHNICAL FIELD

The present disclosure relates to a semiconductor package in which a semiconductor chip is mounted on a printed circuit board such as a package board and/or an interposer board, and a semiconductor chip included in the same.

BACKGROUND

Recently, demand for high-performance semiconductors has increased. Due to a speed increase and performance improvement of such semiconductors, the number of layers of a semiconductor chip has increased or a circuit density of the semiconductor chip has increased, and accordingly, manufacturing costs of the semiconductor chip has significantly increased. In addition, a yield problem of the semiconductor chip has also occurred. For example, according to the manufacture of the high-performance semiconductors, the number of layers of a back end of line (BEOL) of the semiconductor chip may increase or a circuit density of the semiconductor chip may increase. Accordingly, manufacturing costs of the semiconductor chip may be significantly increased, and a cost problem may occur due to a decrease in yield of the semiconductor chip caused by the occurrence of a defect during manufacturing of the semiconductor chip.

SUMMARY

An aspect of the present disclosure may provide a semiconductor chip of which a process cost may be decreased, and a semiconductor package including the same.

An aspect of the present disclosure may also provide a semiconductor chip capable of solving a cost problem due to a decrease in yield of the semiconductor chip, and a semiconductor package including the same.

According to an aspect of the present disclosure, a portion of a back end of line (BEOL) layer of a semiconductor chip including wirings for power transmission may be formed on a printed circuit board such as a package board and/or an interposer board.

According to an aspect of the present disclosure, a semiconductor package may include: a semiconductor chip including a front end of line (FEOL) layer and a first back end of line (BEOL) layer disposed on the FEOL layer; and a printed circuit board including a wiring layer and a second BEOL layer disposed on the wiring layer, wherein the semiconductor chip is mounted on the printed circuit board so that the first and second BEOL layers are connected to each other, and the second BEOL layer includes a wiring for power transmission.

According to another aspect of the present disclosure, a semiconductor package may include: a semiconductor chip including a first BEOL layer; an interposer board including a second BEOL layer; and a package board including a wiring layer, wherein the semiconductor chip is mounted on the interposer board, the interposer board is mounted on the package board, the first and second BEOL layers are connected to each other, and the second BEOL layer includes a wiring for power transmission.

According to another aspect of the present disclosure, a semiconductor chip may include: a FEOL layer including a plurality of circuit units each including a plurality of transistor elements; and a BEOL layer disposed on the FEOL layer and including a wiring unit electrically connected to the plurality of circuit units, wherein the wiring unit does not include a trace pattern for power transmission interconnecting at least two of the plurality of circuit units.

According to another aspect of the present disclosure, a semiconductor package may include: a semiconductor chip including a FEOL layer and a first BEOL layer disposed on the FEOL layer, the FEOL layer including a first circuit unit including a plurality of first transistor elements and a second circuit unit including a plurality of second transistor elements, and the first BEOL layer including a first wiring unit electrically connected to the first and second circuit units; and a printed circuit board including a second BEOL layer including a second wiring unit electrically connected to the first wiring unit, wherein the semiconductor chip is mounted on the printed circuit board, the first wiring unit does not include a trace pattern for power transmission interconnecting the first and second circuit units within the first BEOL layer, and the second wiring unit includes a trace pattern for power transmission interconnecting the first and second circuit units within the second BEOL layer.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, the phrase "in cross section" may refer to a cross-sectional shape of a target when the target is vertically cut or a cross-sectional shape of the target when the target is viewed in side view. In addition, the phrase "in plan view" may refer to a shape of the target when the target is horizontally cut or a shape of the target when the target is viewed in top view or bottom view.

Herein, a lower side, a lower portion, a lower surface, and the like, are used to refer to a direction toward a mounted surface of the semiconductor package including an organic interposer in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description conceptually includes an indirect connection through an adhesive layer as well as a direct connection between two components. In addition, "electrically connected" conceptually includes a physical connection and a physical disconnection. It may be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure. In this case, singular forms include plural forms unless interpreted otherwise in context.

Electronic Device

Figure 1:
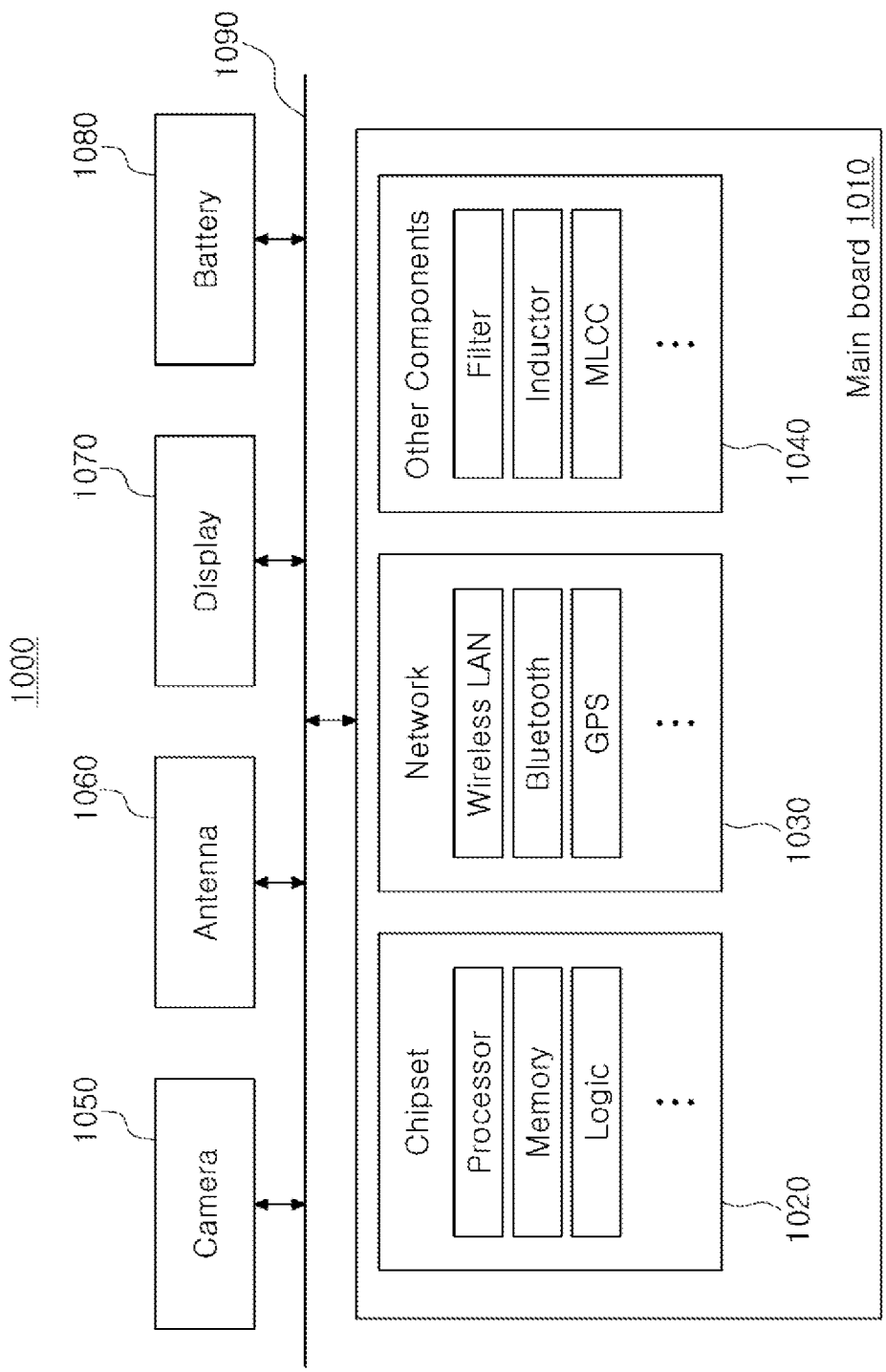
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip-related components 1020, network related components 1030, other components 1040, and the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip-related components 1020 are not limited thereto, and may also include other types of chip-related components. In addition, these chip-related components 1020 may be combined with each other. These chip-related components 1020 may have a package form including the chips or the electronic components described above.

The network related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, and may also include a variety of other wireless or wired standards or protocols. In addition, the network related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, these other components 1040 are not limited thereto, and may also include chip component types of passive components used for various other purposes, or the like. In addition, other components 1040 may be combined with each other, together with the chip-related components 1020 or the network related components 1030 described above.

Depending on a type of the electronic device 1000, the electronic device 1000 may include other components that may or may not be physically or electrically connected to the mainboard 1010. These other electronic components may include, for example, a camera 1050, an antenna 1060, a display 1070, a battery 1080, or the like. These other electronic components are not limited thereto, and may be an audio codec, a video codec, a power amplifier, a compass, an accelerometer, a gyroscope, a speaker, a mass storage unit (for example, a hard disk drive), a compact disk (CD) drive, a digital versatile disk (DVD) drive, or the like. These other electronic components may also include other electronic components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device processing data.

Figure 2:
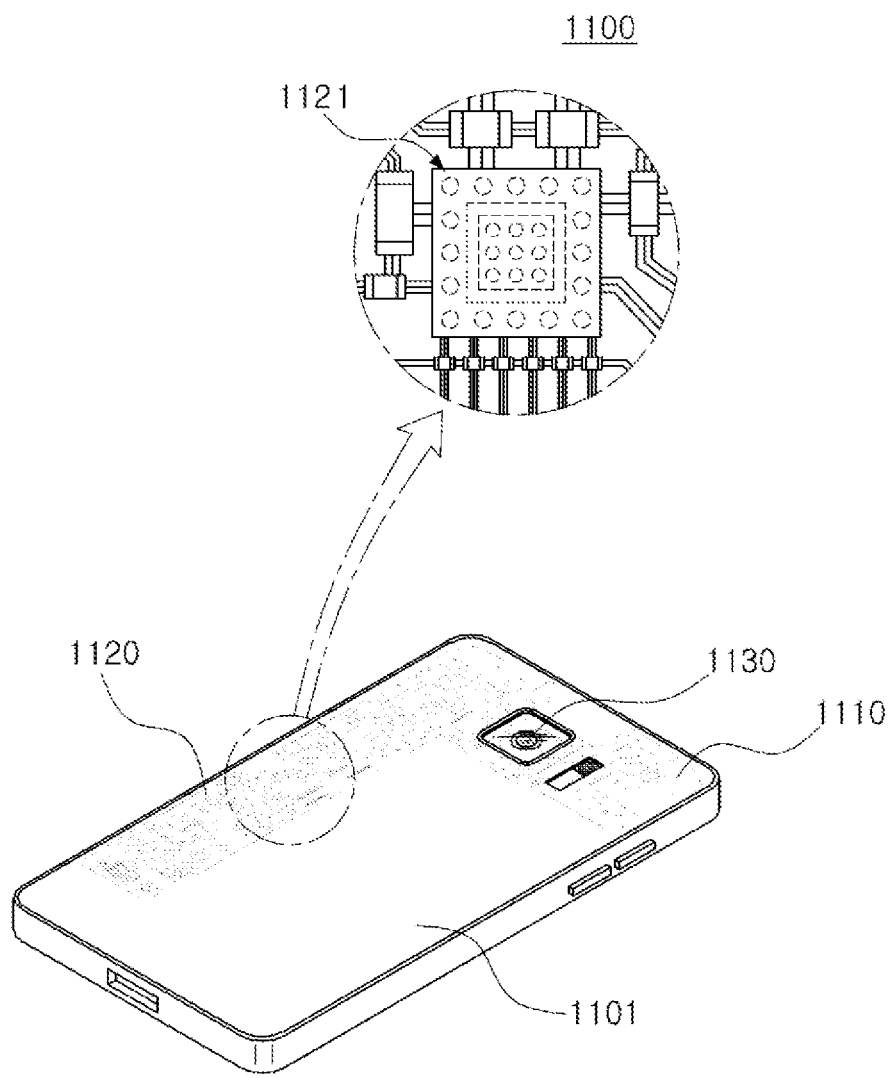
FIG. 2 is a schematic perspective view illustrating an example of an electronic device.

FIG. 2 is a schematic perspective view illustrating an example of an electronic device.

Referring to FIG. 2, an electronic device may be, for example, a smartphone 1100. A motherboard 1110 may be accommodated in the smartphone 1100, and various components 1120 may be physically or electrically connected to the motherboard 1110. In addition, other components that may or may not be physically or electrically connected to the motherboard 1110, such as a camera module 1130 and/or a speaker 1140, may be accommodated in the smartphone 1100. Some of the electronic components 1120 may be the above-described chip-related components, for example, a semiconductor package 1121, and are not limited thereto. The semiconductor package 1121 may have a form in which a semiconductor chip or the like is surface-mounted on a printed circuit board such as a package board and/or an interposer board. Meanwhile, the electronic device is not necessarily limited to the smartphone 1100, and may be other electronic devices as described above.

Semiconductor Package

Figure 3:
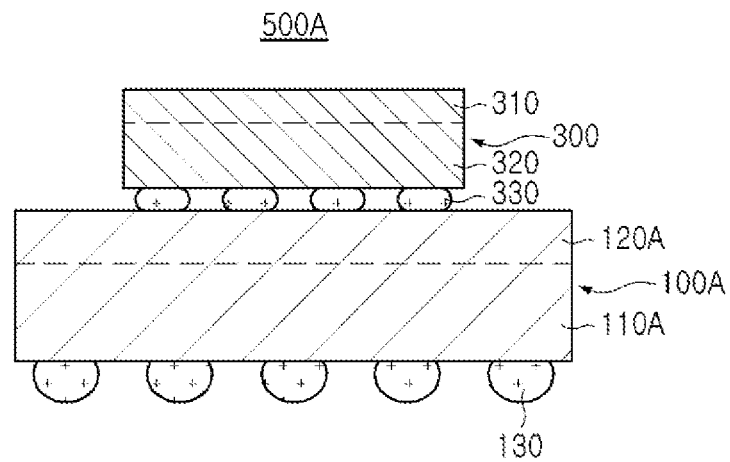
FIG. 3 is a schematic cross-sectional view illustrating a semiconductor package according to an exemplary embodiment in the present disclosure.

FIG. 3 is a schematic cross-sectional view illustrating a semiconductor package according to an exemplary embodiment in the present disclosure.

Referring to FIG. 3, a semiconductor package 500A according to an exemplary embodiment may include a semiconductor chip 300 including a front end of line (FEOL) layer 310 and a first back end of line (BEOL) layer 320 disposed on the FEOL layer 310; and a printed circuit board 100A including a wiring layer 110A and a second BEOL layer 120A disposed on the wiring layer 110A. The semiconductor chip 300 may be mounted on the printed circuit board 100A so that the first and second BEOL layers 320 and 120A are connected to each other. The second BEOL layer 120A may include wirings for power transmission. The printed circuit board 100A may be a package board, but is not limited thereto.

Meanwhile, recently, the demand for high-performance semiconductors has increased. Due to a speed increase and performance improvement of the semiconductors, the number of layers of a semiconductor chip has increased or a circuit density of the semiconductor chip has increased, and accordingly, manufacturing costs of the semiconductor chip have significantly increased. In addition, a yield problem of the semiconductor chip has also occurred. For example, according to the manufacture of the high-performance semiconductors, the number of layers of a BEOL of the semiconductor chip may increase or a circuit density of the semiconductor chip may increase. Accordingly, manufacturing costs of the semiconductor chip may be significantly increased, and a cost problem may occur due to a decrease in yield of the semiconductor chip caused by the occurrence of a defect during manufacture of the semiconductor chip.

On the other hand, in the semiconductor package 500A according to an exemplary embodiment, a portion of an existing BEOL layer of the semiconductor chip 300, more specifically, a metal layer including wirings for power transmission having a relatively great wiring pitch may be formed in the printed circuit board 100A. In this case, the number of layers of the printed circuit board 100A may be increased, but the number of layers of the existing BEOL layer of the semiconductor chip 300 having a relatively high process difficulty and cost may be decreased, and accordingly, a process cost may be significantly decreased in terms of the entire semiconductor package. In addition, it may be more advantageous in terms of cost to discard the printed circuit board 100A due to the occurrence of defects in the wirings for power transmission than to discard the semiconductor chip 300 due to the occurrence of defects in the wirings for power transmission, and thus, a cost problem due to a decrease in yield of the semiconductor chip 300 may also be solved.

The semiconductor chip 300 may include an integrated circuit (IC) provided in an amount of several hundred to several million or more elements integrated in a single chip. In this case, the IC may be, for example, a logic chip such as a central processor (for example, a CPU), a graphic processor (for example, a GPU), a field programmable gate array (FPGA), a digital signal processor, a cryptographic processor, a microprocessor, a microcontroller, an application processor (for example, an AP), an analog-to-digital converter, an application-specific IC (ASIC), or the like. Alternatively, the semiconductor chip 300 may be a memory chip such as a volatile memory (for example, a DRAM), a non-volatile memory (for example, a ROM), a flash memory, a high bandwidth memory, or the like. Alternatively, the semiconductor chip 300 may be another type of chip such as a power management IC (PMIC).

The FEOL layer 310 may include a semiconductor substrate, a transistor element formed on the semiconductor substrate, and a metal contact region formed on the transistor element. Here, the FEOL layer may include a middle end of line (MEOL) layer. For example, the metal contact region may include a contact hole and a plug connecting a metal layer and a p-n junction diffusion layer on a silicon substrate to each other or connecting the metal layer and a polycrystalline silicon electrode to each other.

The first BEOL layer 320 may include a plurality of insulating layers and a plurality of metal layers. In this case, the plurality of insulating layers may include an inorganic insulating material. In addition, the plurality of metal layers may include a metal material. The plurality of metal layers may mainly include wirings for signal transmission, and may further include some wirings for power transmission and/or some wirings for ground transmission, if necessary. Here, the phrase "mainly include the wirings for signal transmission" may mean that a total area occupied by the wirings for signal transmission is greater than a total area occupied by the wirings for power transmission and/or the wirings for ground transmission in plan view. In the case of a plurality of layers, the sums of areas in plan view in respective layers may be compared with each other, and the areas in plan view in the respective layers may be determined with the exception of vias overlapping trace patterns of the respective layers. Each wiring may include a trace pattern, a via pattern, and the like. The trace pattern may include a pad pattern. The first BEOL layer 320 may be formed on a semiconductor substrate, for example, a silicon substrate, and accordingly, may be formed at a higher density.

The wiring layer 110A may include a plurality of insulating layers and a plurality of metal layers. In this case, the plurality of insulating layers may include an organic insulating material. In addition, the plurality of metal layers may include a metal material. In addition, the plurality of metal layers may include wirings for transmission of various wirings within the wiring layer 110A, for example, wirings for power transmission, wirings for signal transmission, and/or wirings for ground transmission. Each wiring may include a trace pattern, a via pattern, and the like. The trace pattern may include a pad pattern and the like. The plurality of insulating layers and the plurality of wiring layers may be alternately stacked. The wiring layer 110A may be formed on an organic substrate, and accordingly, may be more easily formed at a low cost.

The second BEOL layer 120A may include one or more insulating layers and one or more metal layers. In this case, one or more insulating layers may include an organic insulating material. In addition, one or more metal layers may include a metal material. One or more metal layers may mainly include wirings for power transmission, and may further include some wirings for signal transmission and/or some wirings for ground transmission, if necessary. Here, the wiring for power transmission may be a wiring for transmitting power to the semiconductor chip 300. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping trace patterns or the like of the respective layers. Each wiring may include a trace pattern, a via pattern, and the like. The trace pattern may include a pad pattern and the like. The second BEOL layer 120A may be formed on an organic substrate, and accordingly, may be more easily formed at a low cost.

In some embodiments, silicon may not be disposed between the first and second BEOL layers 320 and 120A. The first BEOL layer 320 may be disposed adjacent to a bottom side of the semiconductor chip 300. The second BEOL layer 120A may be disposed adjacent to a top side of the printed circuit board 100A. As such, the first and second BEOL layers 320 and 120A may be disposed adjacent to each other and be connected to each other, and accordingly, a side effect due to separation of the existing BEOL layer of the semiconductor chip 300 may be significantly decreased. In some embodiments, the first BEOL layer 320 may be spaced apart from the second BEOL layer 120A.

A wiring pitch of the second BEOL layer 120A may be greater than a wiring pitch of the first BEOL layer 320. The second BEOL layer 120A may mainly include wirings for power transmission having a relatively great pitch and formed in a greater size, and may be formed in the printed circuit board 100A, and thus, a pitch of the second BEOL layer 120A may be relatively greater. On the other hand, the first BEOL layer 320 may mainly include wirings for signal transmission having a relatively small pitch and formed to have a smaller size, and may be formed in the semiconductor chip 300, and thus, a pitch of the first BEOL layer 320 may be relatively smaller. Meanwhile, the pitch may be measured using a scanning microscope or the like, and may refer to an approximately average numerical value. For example, the pitch may be an average value of the greatest numerical number and the smallest numerical number.

The semiconductor package 500A according to an exemplary embodiment may further include a plurality of connection conductors 330 disposed between the printed circuit board 100A and the semiconductor chip 300 and connecting the printed circuit board 100A and the semiconductor chip 300 to each other and/or a plurality of electrical connection conductors 130 disposed on the other surface of the printed circuit board 100A opposing one surface of the printed circuit board 100A on which the semiconductor chip 300 is mounted and connected to the printed circuit board 100A.

The plurality of connection conductors 330 may provide electrical connection paths between the printed circuit board 100A and the semiconductor chip 300. The plurality of electrical connection conductors 130 may provide electrical connection paths when the semiconductor package 500A is mounted on another board, for example, a mainboard. Each of the plurality of connection conductors 330 may be a solder bump, but is not limited thereto. Each of the plurality of electrical connection conductors 130 may be a solder ball, but is not limited thereto.

Figure 4:
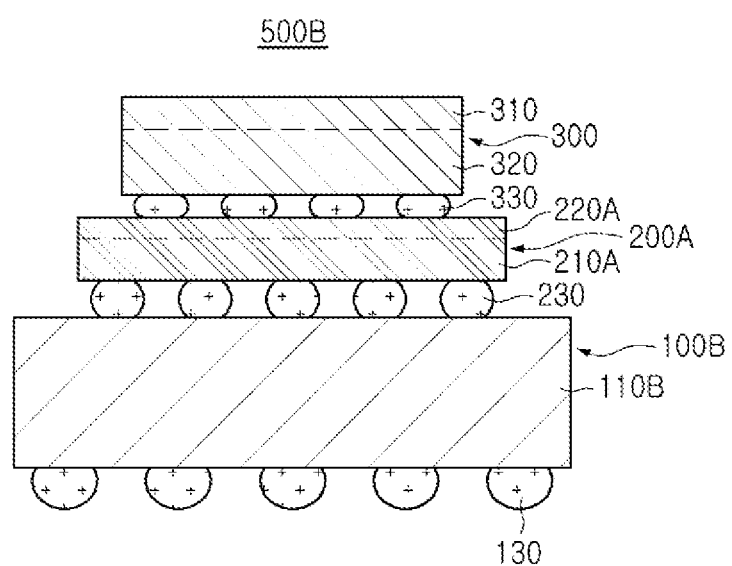
FIG. 4 is a schematic cross-sectional view illustrating a semiconductor package according to another exemplary embodiment in the present disclosure.

FIG. 4 is a schematic cross-sectional view illustrating a semiconductor package according to another exemplary embodiment in the present disclosure.

Referring to FIG. 4, a semiconductor package 500B according to another exemplary embodiment may include a semiconductor chip 300 including a FEOL layer 310 and a first BEOL layer 320 disposed on the FEOL layer 310; an interposer board 200A including a first wiring layer 210A and a second BEOL layer 220A disposed on the first wiring layer 210A; and a package board 100B including a second wiring layer 110B. The semiconductor chip 300 may be mounted on the interposer board 200A so that the first and second BEOL layers 320 and 220A are connected to each other. The interposer board 200A may be mounted on the package board 100B so that the first and second wiring layers 210A and 110B are connected to each other. The interposer board 200A may be an organic interposer in which wirings are formed on an insulating layer including an organic insulating material, for example, a coreless type board or be an inorganic interposer in which wirings are formed on an insulating layer including an inorganic insulating material, for example, a silicon interposer, but is not limited thereto.

In the semiconductor package 500B according to another exemplary embodiment, a portion of an existing BEOL layer of the semiconductor chip 300, more specifically, a metal layer including wirings for power transmission having a relatively great wiring pitch may be formed in the interposer board 200A. In this case, the number of layers of the interposer board 200A may be increased, but the number of layers of the existing BEOL layer of the semiconductor chip 300 having a relatively high process difficulty and cost may be decreased, and accordingly, a process cost may be significantly decreased in terms of the entire semiconductor package. In addition, it may be more advantageous in terms of cost to discard the interposer board 200A due to the occurrence of defects in the wirings for power transmission than to discard the semiconductor chip 300 due to the occurrence of defects in the wirings for power transmission, and thus, a cost problem due to a decrease in yield of the semiconductor chip 300 may also be solved.

The first wiring layer 210A may include a plurality of insulating layers and a plurality of metal layers. In this case, the plurality of insulating layers may include an organic insulating material or an inorganic insulating material. In addition, the plurality of metal layers may include a metal material. In addition, the plurality of metal layers may include wirings for transmission of various wirings within the first wiring layer 210A, for example, wirings for power transmission, wirings for signal transmission, and/or wirings for ground transmission. Each wiring may include a trace pattern, a via pattern, and the like. The trace pattern may include a pad pattern and the like. The plurality of insulating layers and the plurality of wiring layers may be alternately stacked.

The second BEOL layer 220A may include one or more insulating layers and one or more metal layers. In this case, one or more insulating layers may include an organic insulating material or an inorganic insulating material. In addition, one or more metal layers may include a metal material. One or more metal layers may mainly include wirings for power transmission, and may further include some wirings for signal transmission and/or some wirings for ground transmission, if necessary. Here, the wiring for power transmission may be a wiring for transmitting power to the semiconductor chip 300. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping trace patterns or the like of the respective layers. Each wiring may include a trace pattern, a via pattern, and the like. The trace pattern may include a pad pattern and the like.

The first BEOL layer 320 may be disposed adjacent to a bottom side of the semiconductor chip 300. The second BEOL layer 220A may be disposed adjacent to a top side of the interposer board 200A. As such, the first and second BEOL layers 320 and 220A may be disposed adjacent to each other and be connected to each other, and accordingly, a side effect due to separation of the existing BEOL layer of the semiconductor chip 300 may be significantly decreased.

A wiring pitch of the second BEOL layer 220A may be greater than a wiring pitch of the first BEOL layer 320. The second BEOL layer 220A may mainly include wirings for power transmission having a relatively great pitch and formed in a greater size, and may be formed in the interposer board 200A, and thus, a pitch of the second BEOL layer 220A may be relatively greater. On the other hand, the first BEOL layer 320 may mainly include wirings for signal transmission having a relatively small pitch and formed in a smaller size, and may be formed in the semiconductor chip 300, and thus, a pitch of the first BEOL layer 320 may be relatively smaller. Meanwhile, the pitch may be measured using a scanning microscope or the like, and may refer to an approximately average numerical value. For example, the pitch may be an average value of the greatest numerical number and the smallest numerical number.

The semiconductor package 500B according to another exemplary embodiment may further include a plurality of connection conductors 330 disposed between the semiconductor chip 300 and the interposer board 200A and connecting the semiconductor chip 300 and the interposer board 200A to each other, a plurality of first electrical connection conductors 230 disposed between the interposer board 200A of the package board 100B and connecting the interposer board 200A of the package board 100B to each other, and/or a plurality of second electrical connection conductors 130 disposed on the other surface of the package board 100B opposing one surface of the package board 100B on which the interposer board 200A is disposed and connected to the package board 100B.

The plurality of connection conductors 330 may provide electrical connection paths between the interposer board 200A and the semiconductor chip 300. The plurality of first electrical connection conductors 230 may provide electrical connection paths between the package board 100B and the interposer board 200A. The plurality of second electrical connection conductors 130 may provide electrical connection paths when the semiconductor package 500B is mounted on another board, for example, a mainboard. Each of the plurality of connection conductors 330 may be a solder bump, but is not limited thereto. Each of the plurality of first and second electrical connection conductors 230 and 130 may be a solder ball, but is not limited thereto.

Other contents, for example, the contents described in the semiconductor package 500A according to the exemplary embodiment described above may be applied to the semiconductor package 500B according to another exemplary embodiment described above as long as there is no contradiction, and a description of overlapping contents is omitted.

Figure 5:
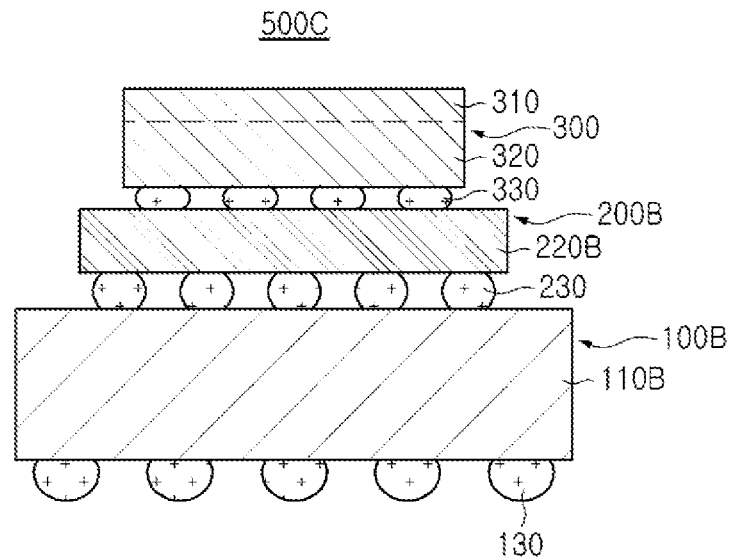
FIG. 5 is a schematic cross-sectional view illustrating a semiconductor package according to another exemplary embodiment in the present disclosure.

FIG. 5 is a schematic cross-sectional view illustrating a semiconductor package according to another exemplary embodiment in the present disclosure.

Referring to FIG. 5, a semiconductor package 500C according to another exemplary embodiment may include a semiconductor chip 300 including a FEOL layer 310 and a first BEOL layer 320 disposed on the FEOL layer 310; an interposer board 200B including a second BEOL layer 220B; and a package board 100B including a wiring layer 110B. The semiconductor chip 300 may be mounted on the interposer board 200B so that the first and second BEOL layers 320 and 220B are connected to each other. The interposer board 200B may be mounted on the package board 100B so that the second BEOL layer 220B and the wiring layer 110B are connected to each other. The interposer board 200B may be an organic interposer in which wirings are formed on an insulating layer including an organic insulating material, for example, a coreless type board or be an inorganic interposer in which wirings are formed on an insulating layer including an inorganic insulating material, for example, a silicon interposer, but is not limited thereto.

In the semiconductor package 500C according to another exemplary embodiment, a portion of an existing BEOL layer of the semiconductor chip 300, more specifically, a metal layer including wirings for power transmission having a relatively great wiring pitch may be formed in the interposer board 200B. In this case, the number of layers of the interposer board 200B may be increased, but the number of layers of the existing BEOL layer of the semiconductor chip 300 having a relatively high process difficulty and cost may be decreased, and accordingly, a process cost may be significantly decreased in terms of the entire semiconductor package. In addition, it may be more advantageous in terms of cost to discard the interposer board 200B due to the occurrence of defects in the wirings for power transmission than to discard the semiconductor chip 300 due to the occurrence of defects in the wirings for power transmission, and thus, a cost problem due to a decrease in yield of the semiconductor chip 300 may also be solved.

In the semiconductor package 500C according to another exemplary embodiment, the interposer board 200B may include the second BEOL layer 220B, but may not include a separate additional wiring layer. Accordingly, the number of layers of the interposer board 200B may be significantly decreased. Accordingly, a thickness may be decreased, process difficulty may be decreased, and a yield may be improved.

The second BEOL layer 220B may include one or more insulating layers and one or more metal layers. In this case, one or more insulating layers may include an organic insulating material or an inorganic insulating material. In addition, one or more metal layers may include a metal material. One or more metal layers may mainly include wirings for power transmission, and may further include some wirings for signal transmission and/or some wirings for ground transmission, if necessary. Here, the wiring for power transmission may be a wiring for transmitting power to the semiconductor chip 300. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping trace patterns or the like of the respective layers. Each wiring may include a trace pattern, a via pattern, and the like. The trace pattern may include a pad pattern and the like. One or more insulating layers and one or more metal layers may be alternately stacked.

Other contents, for example, the contents described in the semiconductor packages 500A and 500B described above may be applied to the semiconductor package 500C according to another exemplary embodiment described above as long as there is no contradiction, and a description of overlapping contents is omitted.

Figure 6:
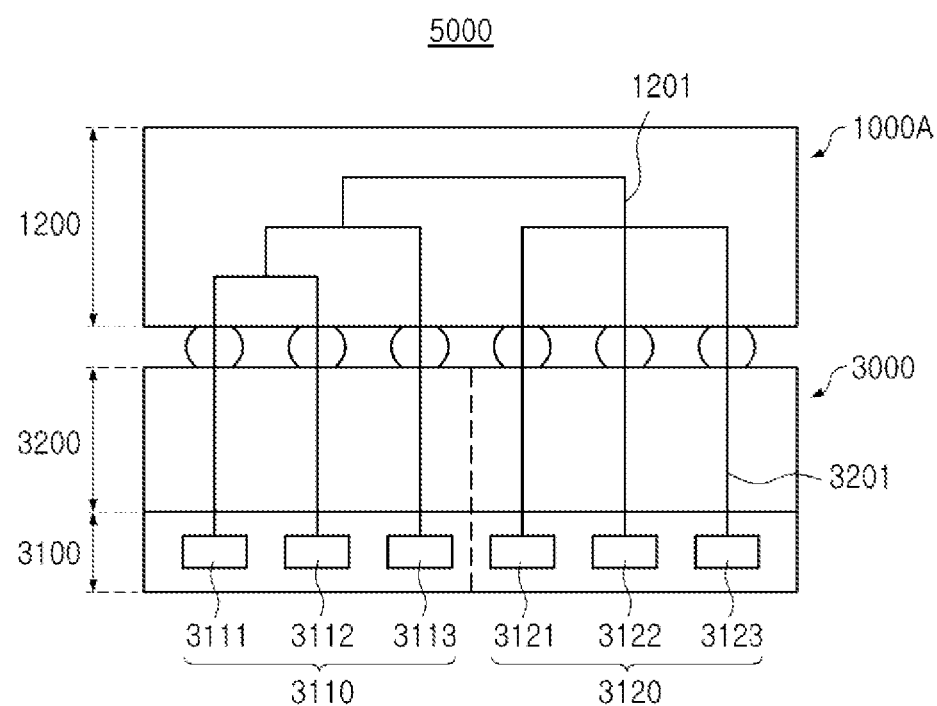
FIG. 6 is a schematic cross-sectional view illustrating wirings for power transmission within a semiconductor package after applying a portion of a back end of line (BEOL) layer of a semiconductor chip to a printed circuit board.

FIG. 6 is a schematic cross-sectional view illustrating wirings for power transmission within a semiconductor package after applying a portion of a BEOL layer of a semiconductor chip to a printed circuit board.

Meanwhile, for convenience of explanation, other components except for transistor elements, wirings for power transmission, and the like, have been omitted in FIG. 6, and such omitted components may be understood based on the contents described above or contents to be described later.

Referring to FIG. 6, a semiconductor package 5000 may include a printed circuit board 1000A and a semiconductor chip 3000 mounted on the printed circuit board 1000A. The semiconductor chip 3000 may include a FEOL layer 3100 and a first BEOL layer 3200 disposed on the FEOL layer 3100. The FEOL layer 3100 may include a first circuit unit 3110 including a plurality of first transistor elements 3111, 3112, and 3113, and a second circuit unit 3120 including a plurality of second transistor elements 3121, 3122, and 3123. The first BEOL layer 3200 may include a first wiring unit 3201 electrically connected to the first and second circuit units 3110 and 3120. A second BEOL layer 1200 may include a second wiring unit 1201 electrically connected to the first wiring unit 3201.

The first wiring unit 3201 may not include a trace pattern for power transmission interconnecting the first and second circuit units 3110 and 3120 within the first BEOL layer 3200. For example, the first wiring unit 3201 may include wirings for power transmission, specifically, via patterns for power transmission, independently connected to the first and second circuit units 3110 and 3120 within the first BEOL layer 3200. Each of the first and second circuit units 3110 and 3120 may be a unit circuit having a specific function or a block circuit of a greater unit than the unit circuit. The FEOL layer 3100 may include a greater number of such circuit units, and the first wiring unit 3201 may not include a trace pattern for power transmission interconnecting at least two of a plurality of circuit units. Such interconnection may be performed in the second BEOL layer 1200 of the printed circuit board 1000A. Meanwhile, although not illustrated in FIG. 6, the first wiring unit 3201 may further include wirings for signal transmission and/or wirings for ground transmission in addition to the wirings for power transmission, and trace patterns of the wirings for signal transmission and the wirings for ground transmission may interconnect the first and second circuit units 3110 and 3120 within the first BEOL layer 3200, but are not limited thereto.

The first wiring unit 3201 may not include a trace pattern for power transmission interconnecting at least two of the plurality of first transistor elements 3111, 3112, and 3113 within the first BEOL layer 3200, and may not include a trace pattern for power transmission interconnecting at least two of the second transistor elements 3121, 3122, and 3123 within the first BEOL layer 3200. As such, if necessary, the first wiring unit 3201 may not include a trace pattern for power transmission for interconnection between elements of the smallest unit. Meanwhile, although not illustrated in FIG. 6, the first wiring unit 3201 may further include wirings for signal transmission and/or wirings for ground transmission in addition to the wirings for power transmission, and trace patterns of the wirings for signal transmission and the wirings for ground transmission may interconnect at least two of the plurality of first transistor elements 3111, 3112, and 3113 and/or may interconnect at least two of the second transistor elements 3121, 3122, and 3123 within the first BEOL layer 3200, but are not limited thereto.

The second wiring unit 1201 may include a trace pattern for power transmission interconnecting the first and second circuit units 3110 and 3120 within the second BEOL layer 1200. For example, the second wiring unit 1201 may include the trace pattern for power transmission for interconnection between first and second circuit units 3110 and 3120 of the FEOL layer 3100, which is omitted in the first wiring unit 3201 of the first BEOL layer 3200 of the semiconductor chip 3000. The same may go for a case where the FEOL layer 3100 includes a greater number of circuit units. Meanwhile, although not illustrated in FIG. 6, the second wiring unit 1201 may further include wirings for signal transmission and/or wirings for ground transmission in addition to wirings for power transmission, and trace patterns of the wirings for signal transmission and the wirings for ground transmission may not interconnect the first and second circuit units 3110 and 3120 within the second BEOL layer 1200, but are not limited thereto.

The second wiring unit 1201 may also include a trace pattern for power transmission interconnecting at least two of the plurality of first transistor elements 3111, 3112, and 3113 within the second BEOL layer 1200, and may also include a trace pattern for power transmission interconnecting at least two of the second transistor elements 3121, 3122, and 3123 within the second BEOL layer 1200. As such, the second wiring unit 1201 may include a trace pattern for power transmission for interconnection between elements of the smallest unit as well as for a trace pattern interconnection between circuit units of a large unit. Meanwhile, although not illustrated in FIG. 6, a plurality of second wiring units 1201 may further include wirings for signal transmission and/or wirings for ground transmission in addition to the wirings for power transmission, and trace patterns of the wirings for signal transmission and the wirings for ground transmission may not interconnect at least two of the plurality of first transistor elements 3111, 3112, and 3113 and/or may not interconnect at least two of the second transistor elements 3121, 3122, and 3123 within the second BEOL layer 1200, but are not limited thereto.

Meanwhile, the printed circuit board 1000A may be a package board, an interposer board, or the like, and accordingly, the contents described in the semiconductor packages 500A, 500B, and 500C described above may also be applied to the semiconductor package 5000. For example, the printed circuit board 1000A may further include a separate wiring layer connected to the second wiring unit 1201. In addition, when the printed circuit board 1000A is the interposer board, a printed circuit board such as a separate package board including a wiring unit connected to the second wiring unit 1201 may be further disposed. In addition, as a specific structure of the printed circuit board 1000A, a package board 100A-1 or 100A-2, an interposer board 200A-1, 200A-2, 200B-1, or 200B-2, or the like, to be described later, may be applied. In addition, a structure of a BEOL layer 1320-2 or a structure of a semiconductor chip 300, 300', or 300" to be described later may be applied to the semiconductor chip 3000. Overlapping descriptions thereof are omitted.

Figure 7A:
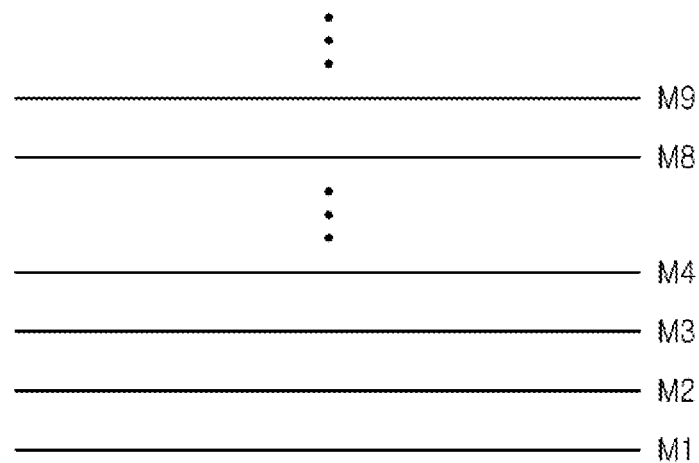
FIG. 7A is a schematic cross-sectional view illustrating a plurality of metal layers of a BEOL layer of a semiconductor chip before applying a portion of the BEOL layer of the semiconductor chip to a printed circuit board.

FIG. 7A is a schematic cross-sectional view illustrating a plurality of metal layers of a BEOL layer of a semiconductor chip before applying a portion of the BEOL layer of the semiconductor chip to a printed circuit board.

Figure 7B:
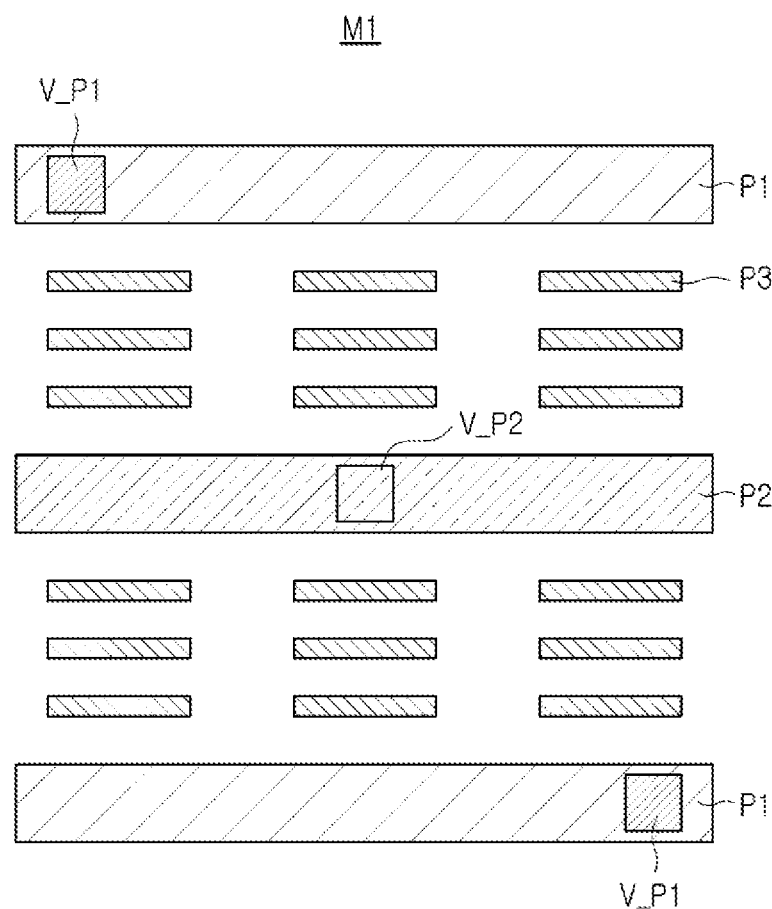
FIGS. 7B and 7C are schematic plan views illustrating an M1 layer and an M2 layer of the plurality of metal layers of FIG. 7A, respectively.
Figure 7C:
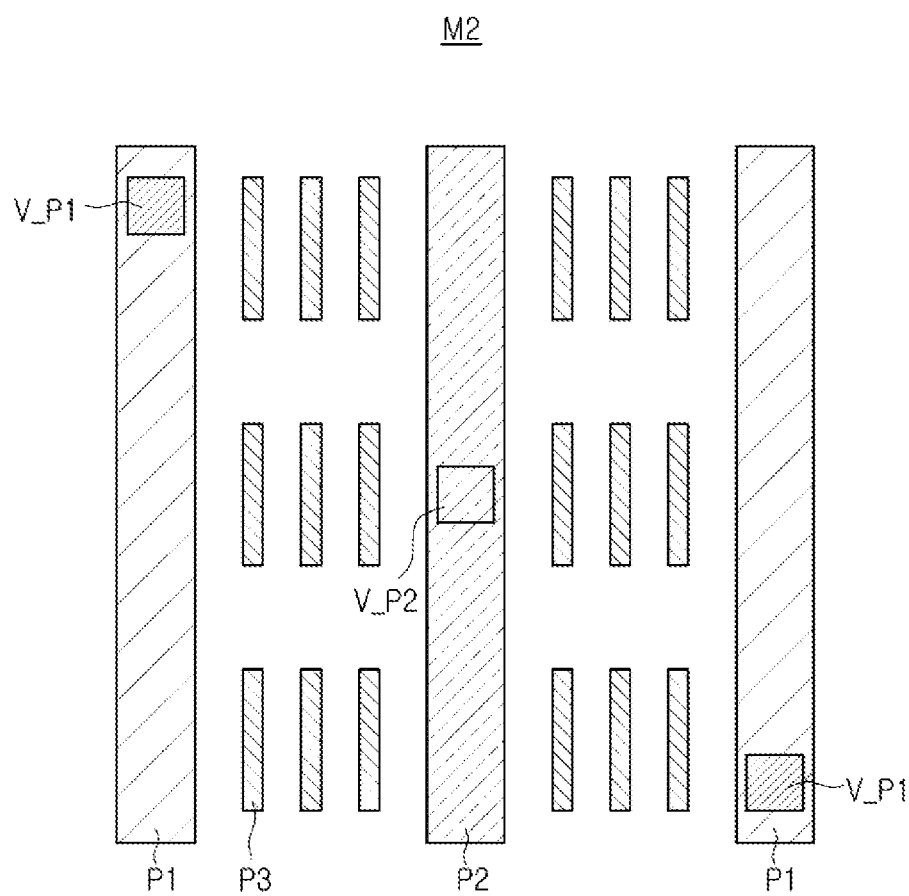

FIGS. 7B and 7C are schematic plan views illustrating an M1 layer and an M2 layer of the plurality of metal layers of FIG. 7A, respectively.

In FIGS. 7A through 7C, only some layers may be illustrated for convenience, and in order to indicate connections between patterns of an upper metal layer and patterns of a lower metal layer, some vias are illustrated together with the patterns for convenience of explanation even though they are positioned below the patterns of the upper metal layer.

Referring to FIGS. 7A through 7C, a BEOL layer 1320-1 of a semiconductor chip may include a plurality of metal layers M1, M2, M3, M4, . . . M8, M9, . . . . The number of metal layers M1, M2, M3, M4, . . . M8, M9, . . . is not particularly limited, and may be various depending on a design. The metal layers M1, M2, M3, M4, . . . M8, M9, . . . may include trace patterns and via patterns. In this case, the trace patterns may include pad patterns connected to the via patterns. The metal layers M1, M2, M3, M4, . . . M8, M9, . . . may include a low-resistance conductive material such as copper (Cu), aluminum (Al), or tungsten (W).

Metal layers M1, M2, M3, and M4 adjacent to a FEOL layer of the semiconductor chip, for example, first and second metal layers M1 and M2, among the plurality of metal layers M1, M2, M3, M4, . . . M8, M9, . . . may include trace patterns P1 and P2 for power transmission and trace patterns P3 for signal transmission. In addition, these metal layers may include via patterns V_P1 and V_P2 for power transmission connected to the trace patterns P1 and P2 for power transmission. In addition, although not illustrated in FIGS. 7A through 7C, these metal layers may also include via patterns for signal transmission connected to the trace patterns P3 for signal transmission.

The first trace pattern P1 for power transmission may include a trace pattern for a positive supply voltage VDD. The first via pattern V_P1 for power transmission may include a via pattern for a positive supply voltage VDD. The second trace pattern P2 for power transmission may include a trace pattern for a negative supply voltage VSS. The second via pattern V_P2 for power transmission may include a via pattern for a negative supply voltage VSS. However, the present disclosure is not limited thereto, and the trace patterns P1 and P2 for power transmission and the via patterns V_P1 and V_P2 for power transmission may include patterns for different types of voltages. The trace pattern and the via pattern for a negative supply voltage VSS may be a ground pattern while being a voltage pattern. That is, if necessary, the voltage pattern may include the ground pattern.

Meanwhile, the metal layers M1, M2, M3, and M4 adjacent to the FEOL layer of the semiconductor chip, for example, the first and second metal layers M1 and M2 may be layers with a high circuit density, and may require, for example, a fine pitch of the trace patterns P3 for signal transmission. In this case, when the trace patterns P1 and P2 for power transmission having a relatively large wiring pitch are designed together with the trace patterns P3 for signal transmission on the first and second metal layers M1 and M2, the process difficulty may become higher, as described above. Therefore, manufacturing costs of the semiconductor chip may be significantly increased, and a defect may occur in a manufacturing process of the semiconductor chip, which may cause a cost problem due to a decrease in yield of the semiconductor chip.

Figure 8A:
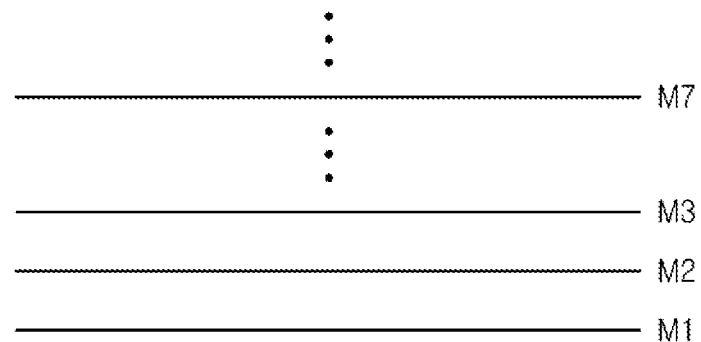
FIG. 8A is a schematic cross-sectional view illustrating a plurality of metal layers of a BEOL layer of a semiconductor chip after applying a portion of the BEOL layer of the semiconductor chip to a printed circuit board.

FIG. 8A is a schematic cross-sectional view illustrating a plurality of metal layers of a BEOL layer of a semiconductor chip after applying a portion of the BEOL layer of the semiconductor chip to a printed circuit board.

Figure 8B:
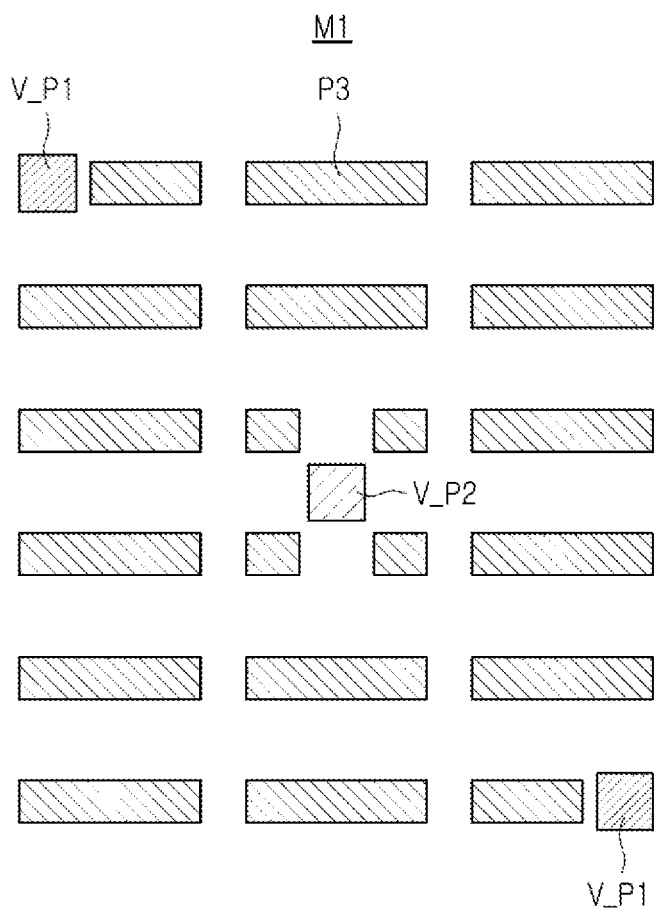
FIGS. 8B and 8C are schematic plan views illustrating an M1 layer and an M2 layer of the plurality of metal layers of FIG. 8A, respectively.
Figure 8C:
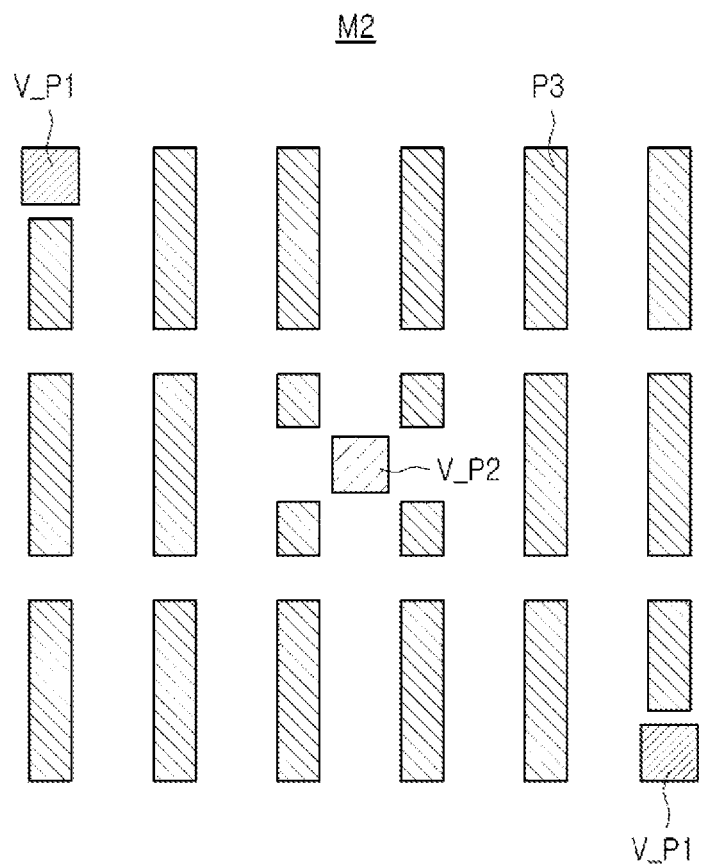

FIGS. 8B and 8C are schematic plan views illustrating an M1 layer and an M2 layer of the plurality of metal layers of FIG. 8A, respectively.

In FIGS. 8A through 8C, only some layers may be illustrated for convenience, and in order to indicate connections between patterns of an upper metal layer and patterns of a lower metal layer, some vias are illustrated together with the patterns for convenience of explanation even though they are positioned below the patterns of the upper metal layer.

Referring to FIGS. 8A through 7C, a BEOL layer 1320-2 of a semiconductor chip may include a plurality of metal layers M1, M2, M3, . . . M7, . . . . In this case, a portion of the BEOL layer 1320-2 of the semiconductor chip may be applied to the printed circuit board, and the number of metal layers M1, M2, M3, . . . M7, . . . may thus be decreased as compared with the BEOL layer 1320-1 described above before a portion of the BEOL layer 1320-1 is applied to the printed circuit board. For example, metal layers M1, M2, and M3 adjacent to a FEOL layer of the semiconductor chip, for example, first and second metal layers M1 and M2, among the plurality of metal layers M1, M2, M3, . . . M7, . . . may include trace patterns P3 for signal transmission, but may not include the trace patterns P1 and P2 for power transmission described above. For example, the trace patterns P1 and P2 for power transmission described above may be separately designed as a BEOL layer in the printed circuit board. In this case, the first and second metal layers M1 and M2 may include only via patterns V_P1 and V_P2 for power transmission without the trace patterns P1 and P2 for power transmission described above. The via patterns V_P1 and V_P2 for power transmission may be electrically connected to wirings for power transmission of the BEOL layer designed in the printed circuit board including the trace patterns P1 and P2 for power transmission described above. If necessary, some of the trace patterns P1 and P2 for power transmission described above may be designed on metal layers M7, for example, a seventh metal layer M7, relatively far from the FEOL layer of the semiconductor chip among the plurality of metal layers M1, M2, M3, . . . M7, . . . .

As described above, when a portion of the BEOL layer 1320-2 of the semiconductor chip, for example, at least some of the trace patterns P1 and P2 for power transmission that have been designed on lower metal layers M1 and M2 are formed as a separate BEOL layer in the printed circuit board, the number of layer of the existing BEOL layer of the semiconductor chip having high process difficulty and cost may be reduced, and the trace pattern P3 for signal transmission may be designed at a greater pitch, and a process cost may thus be significantly decreased. In addition, a cost problem due to a decrease in yield of the semiconductor chip may be solved.

Meanwhile, the contents described in the BEOL layer 1320-1 of the semiconductor chip described above may be applied to the BEOL layer 1320-2 of the semiconductor chip as long as there is no contradiction, and a description of overlapping contents is omitted. In addition, the contents described in the semiconductor packages 500A, 500B, 500C, and 5000 described above and contents to be described in semiconductor chips 300, 300' and 300'' to be described later may also be applied to the BEOL layer 1320-2 of the semiconductor chip as long as there is no contradiction, and a description of overlapping contents is omitted.

Figure 9A:
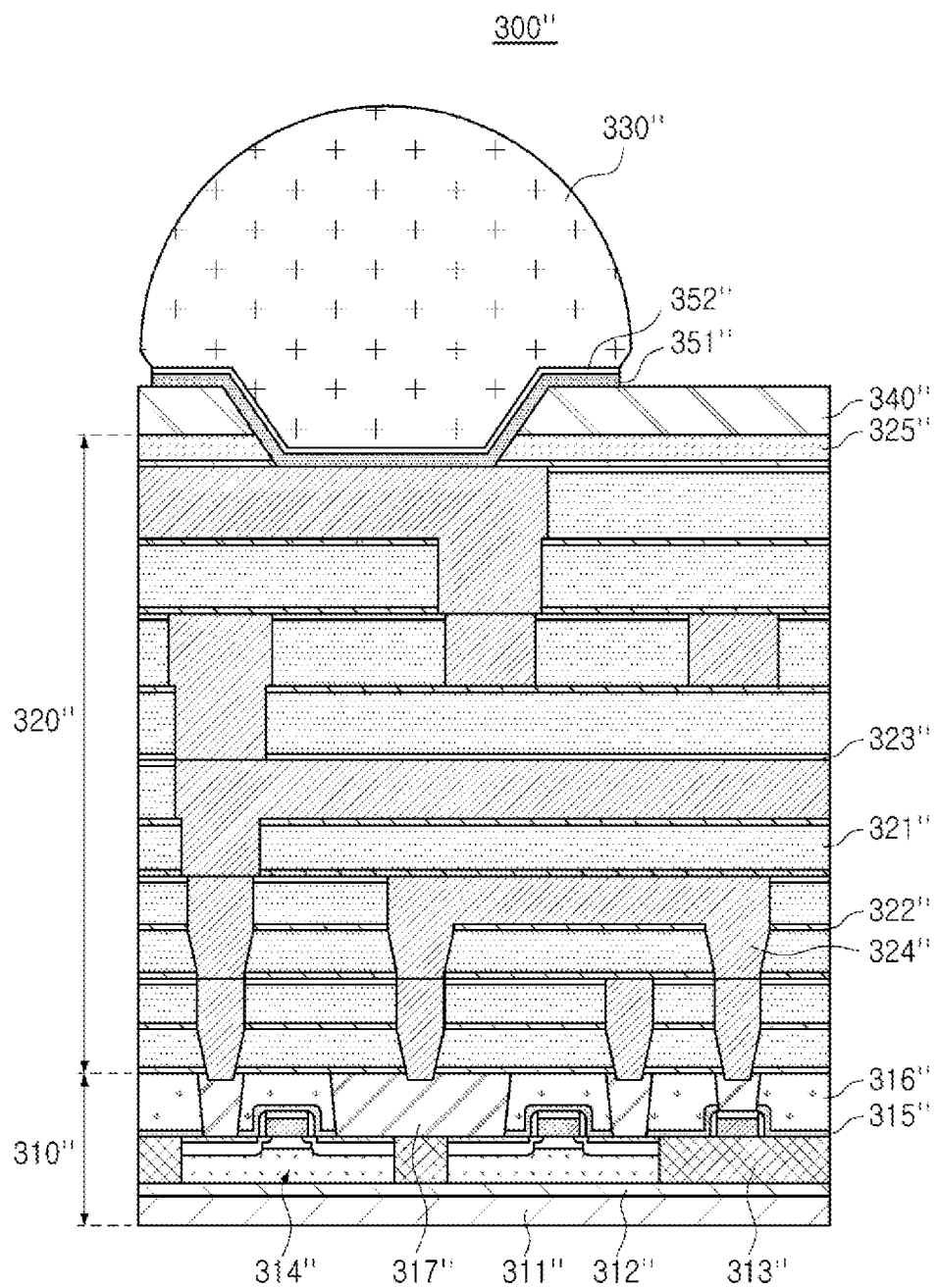
FIGS. 9A and 9B are schematic cross-sectional views illustrating internal structures of a semiconductor chip before and after applying a portion of a BEOL layer of the semiconductor chip to a printed circuit board, respectively.
Figure 9B:
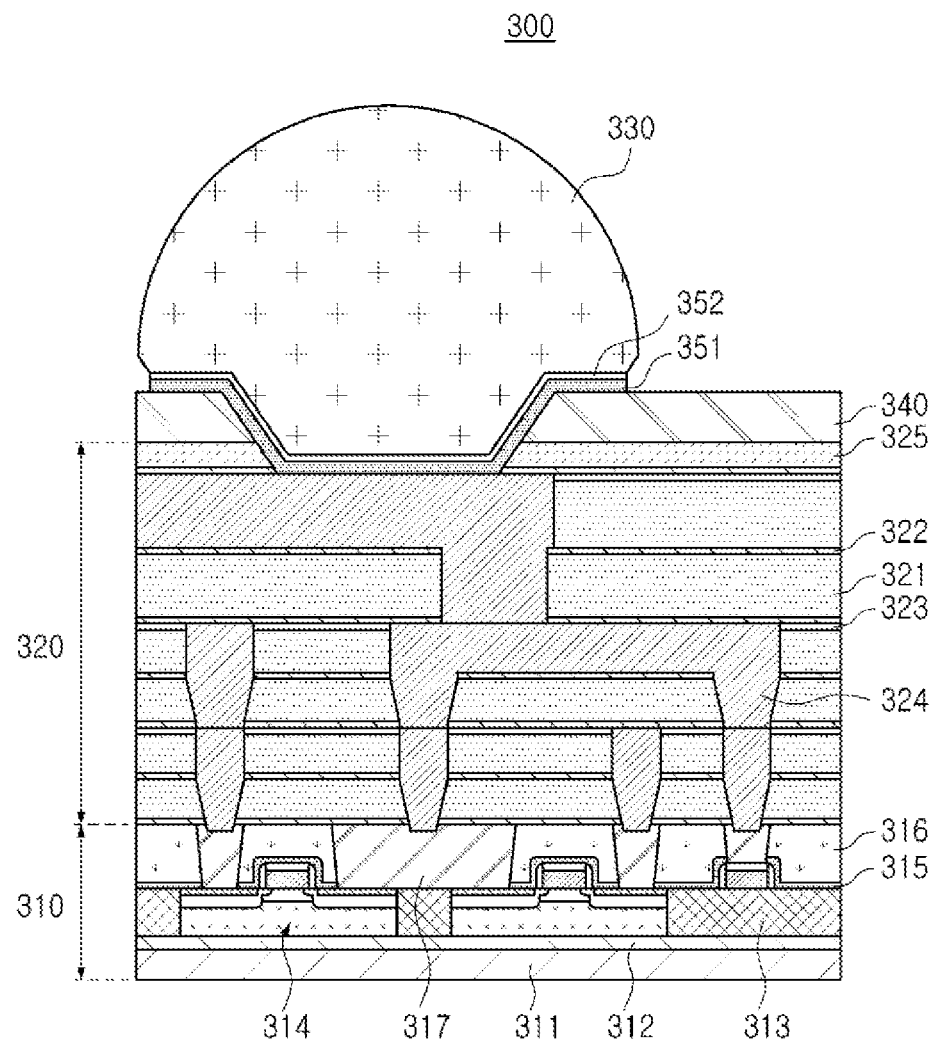

FIGS. 9A and 9B are schematic cross-sectional views illustrating internal structures of a semiconductor chip before and after applying a portion of a BEOL layer of the semiconductor chip to a printed circuit board, respectively.

Meanwhile, an internal structure of a partial region of the semiconductor chip is enlarged and schematically illustrated in FIGS. 9A and 9B, and other regions may be understood based on such a partial region.

Referring to FIGS. 9A and 9B, semiconductor chips 300 and 300'' may include FEOL layers 310 and 310'' and BEOL layers 320 and 320'', respectively. In this case, before a portion of the BEOL layer 320'' is applied to the printed circuit board, the BEOL layer 320'' may include more metal layers 324. Accordingly, manufacturing costs of the semiconductor chip 300'' may significantly increase, and when a defect occurs during manufacture of the semiconductor chip 300'', the semiconductor chip 300'' needs to be discarded, which may cause a significant cost problem due to a decrease in yield of the semiconductor chip 300''. On the other hand, when a portion of the BEOL layer is applied to the printed circuit board, the BEOL layer 320 includes fewer metal layers 324. Accordingly, manufacturing costs of the semiconductor chip 300 may be significantly decreased, and a probability of the occurrence of a defect during manufacture of the semiconductor chip 300 may also be decreased, such that a yield of the semiconductor chip 300 may also be improved.

However, the present disclosure is not limited thereto, and if necessary, the number of metal layers 324 may be similar to or the same as the number of metal layers 324'', but a circuit density of each of the metal layers 324 may become lower. For example, most of wirings for power transmission in each of the metal layers 324 may be omitted, so that wirings for signal transmission, and the like, may be formed more sparsely. Also in this case, manufacturing costs of the semiconductor chip 300 may be significantly decreased, and a probability of the occurrence of a defect during manufacture of the semiconductor chip 300 may also be decreased, such that a yield of the semiconductor chip 300 may also be improved.

Meanwhile, the FEOL layers 310 and 310'' may include, respectively, semiconductor substrates 311 and 312, and 311'' and 312'', lower insulating layers 313 and 313'' each disposed on the semiconductor substrates 311 and 312, and 311'' and 312'', transistor elements 314 and 314'' each disposed on the semiconductor substrates 311 and 312, and 311'' and 312'' and each surrounded by the lower insulating layers 313 and 313'', insulating films 315 and 315'' each covering the transistor elements 314 and 314'' and the lower insulating layers 313 and 313'', upper insulating layers 316 and 316'' each disposed on the insulating films 315 and 315'', and/or plugs 317 and 317'' each penetrating through the upper insulating layers 316 and 316''.

The semiconductor substrate 311, 312, 311'', and 312'' may include a semiconductor material, for example, a group IV semiconductor, a group III-V compound semiconductor, or a group II-VI compound semiconductor. For example, the group IV semiconductor may include silicon, germanium, or silicon-germanium. Each of the semiconductor substrates 311, 312, 311'', and 312'' may also be provided as, for example, a bulk wafer, an epitaxial layer, a silicon on insulator (SOI) layer, a semiconductor on insulator (SeOI) layer, or the like, but is not limited thereto.

Each of the transistor elements 314 and 314'' may include a gate insulating layer, a gate electrode, a capping layer, a spacer, and the like. Source and drain regions may be disposed on both sides of each of the transistor elements 314 and 314'', respectively. The transistor elements 314 and 314'' may be positioned in a cell region, and may include, for example, a DRAM memory element, a flash memory element, or a complementary metal oxide semiconductor (CMOS) image sensor (CIS) element, and the like, but is not limited thereto, and may also include other logic element, power element, and the like.

The plugs 317 and 317'' may be electrically connected to the transistor elements 314 and 314'' and the metal layers 324 and 324'', respectively. The plugs 317 and 317'' may include copper (Cu), tungsten (W), or combinations thereof.

In addition, the BEOL layers 320 and 320'' may include, respectively, interlayer insulating layers 321 and 321'', first interlayer insulating films 322 and 322'' and the second interlayer insulating film 323 and 323'' each disposed between the interlayer insulating layers 321 and 321'', metal layers 324 and 324'' each formed in the interlayer insulating layers 321 and 321'', and/or protective layers 325 and 325'' disposed on the interlayer insulating layers 321 and 321''.

The interlayer insulating layers 321 and 321'' may include, for example, oxide, nitride, or oxynitride, and may include, for example, silicon oxide, silicon nitride, or silicon oxynitride, but is not limited thereto. Respective layers of the interlayer insulating layers 321 and 321'' may include the same material or include different materials.

The metal layers 324 and 324'' may include a low-resistance conductive material such as copper (Cu), aluminum (Al), or tungsten (W). Respective layers of the metal layers 324 and 324" may include the same material or include different materials. The respective layers of the metal layers 324 and 324" may include trace patterns, via patterns, and the like. The trace pattern may include a pad pattern connected to the via pattern. Unlike the metal layer 324", the metal layer 324 may mainly include wirings for signal transmission. Here, the phrase "mainly include the wirings for signal transmission" may mean that a total area occupied by the wirings for signal transmission is greater than a total area occupied by the wirings for power transmission and/or the wirings for ground transmission in plan view. In the case of a plurality of layers, the sums of areas in plan view in respective layers may be compared with each other, and the areas in plan view in the respective layers may be determined with the exception of via patterns overlapping trace patterns or the like of the respective layers.

The metal layers 324 and 324" may be surrounded by diffusion prevention layers. The diffusion prevention layer may include at least one selected from the group consisting of titanium (Ti), titanium nitride (TiN), tantalum (Ta), tantalum nitride (TaN), ruthenium (Ru), cobalt (Co), manganese (Mn), tungsten nitride (WN), nickel (Ni), and nickel boron (NiB).

Meanwhile, sealing layers 340 and 340" may be further disposed on the protective layers 325 and 325", respectively, and underbump metal layers 351 and 351" and surface treatment layers 352 and 352" may be further disposed in via holes penetrating through the protective layers 325 and 325" and the sealing layers 340 and 340", respectively. Connection conductors 330 and 330" may be further disposed on the surface treatment layers 352 and 352", respectively.

The underbump metal layers 351 and 351" and the surface treatment layers 352 and 352" may improve reliability of connections with the connection conductors 330 and 330". Each of the underbump metal layers 351 and 351" may include a chrome (Cr) layer and a copper (Cu) layer, and each of the surface treatment layers 352 and 352" may include a nickel (Ni) layer, a gold (Au) layer, and the like, but the underbump metal layers 351 and 351" and the surface treatment layers 352 and 352" are not limited thereto.

The connection conductors 330 and 330" may be formed of a low-melting-point metal, for example, solder such as tin (Sn)-aluminum (Al)-copper (Cu) or tin (Sn)-silver (Ag), or the like. For example, the connection conductors 330 and 330" may include a solder bump. However, this is only an example, and a material of the connection conductors 330 and 330" is not particularly limited thereto.

Meanwhile, the above-described structure is only an example of the semiconductor chips 300 and 300", and internal structures of the semiconductor chips 300 and 300" may be modified.

Other contents, for example, the contents described in the semiconductor packages 500A, 500B, and 500C described above may be applied to the semiconductor chips 300 and 300" as long as there is no contradiction, and a description of overlapping contents is omitted.

Figure 9C:
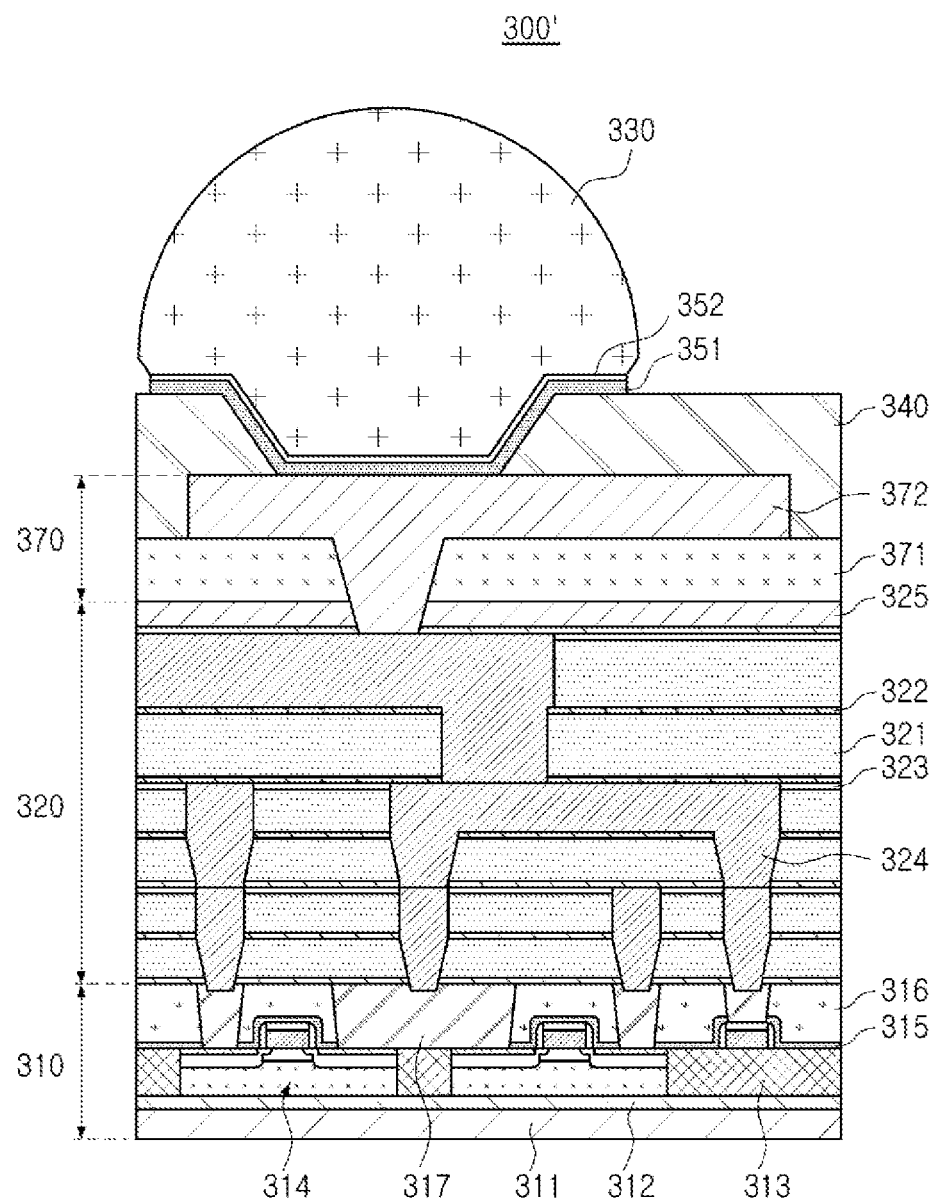
FIG. 9C is a schematic cross-sectional view illustrating a modified example of the semiconductor chip of FIG. 9B.

FIG. 9C is a schematic cross-sectional view illustrating a modified example of the semiconductor chip of FIG. 9B.

Meanwhile, an internal structure of a partial region of the semiconductor chip is enlarged and schematically illustrated in FIG. 9C, and other regions may be understood based on such a partial region.

Referring to FIG. 9C, a semiconductor chip 300' may further include a redistribution layer 370 disposed on the BEOL layer 320 in the semiconductor chip 300 described above.

The redistribution layer 370 includes one or more insulating layers 371 and one or more metal layers 372. In a case where the redistribution layer 370 is further disposed, when the semiconductor chip 300' is applied to the semiconductor packages 500A, 500B, and 500C described above, BEOL layers separated from each other may be connected to each other through the redistribution layer 370. By further forming the redistribution layer 370, a circuit scale for a connection with the substrate may be further expanded.

One or more insulating layers 371 may include an inorganic insulating material, for example, oxide, nitride, or oxynitride, and may include, for example, silicon oxide, silicon nitride, or silicon oxynitride. However, a material of one or more insulating layers 371 is not limited thereto. One or more insulating layers 371 may include an organic insulating material, for example, a thermosetting resin such as an epoxy resin, a thermoplastic resin such as polyimide, Or a resin in which the thermosetting resin or the thermoplastic resin is mixed with an inorganic filler such as silica. The number of one or more insulating layers 371 is not particularly limited, and may be one or be plural. A boundary between the respective insulating layers 371 may be apparent, and in some cases, the respective insulating layers 371 may be integrated with each other without a boundary therebetween.

One or more metal layers 372 may include a low-resistance conductive material such as copper (Cu), aluminum (Al), or tungsten (W). One or more metal layers 372 may include wirings for power transmission, wirings for signal transmission, wirings for ground transmission, and the like. Each of these wirings may include a trace pattern, a via pattern, and the like. The trace pattern may include a pad pattern and the like. The number of one or more metal layers 372 is not particularly limited, and may be one or be plural. A boundary between the respective metal layers 372 may be apparent, and in some cases, the respective metal layers 372 may be integrated with each other without a boundary therebetween.

Other contents, for example, the contents described in the semiconductor packages 500A, 500B, and 500C described above and the semiconductor chips 300 and 300" described above may be applied to the semiconductor chip 300' as long as there is no contradiction, and a description of overlapping contents is omitted.

Figure 10:
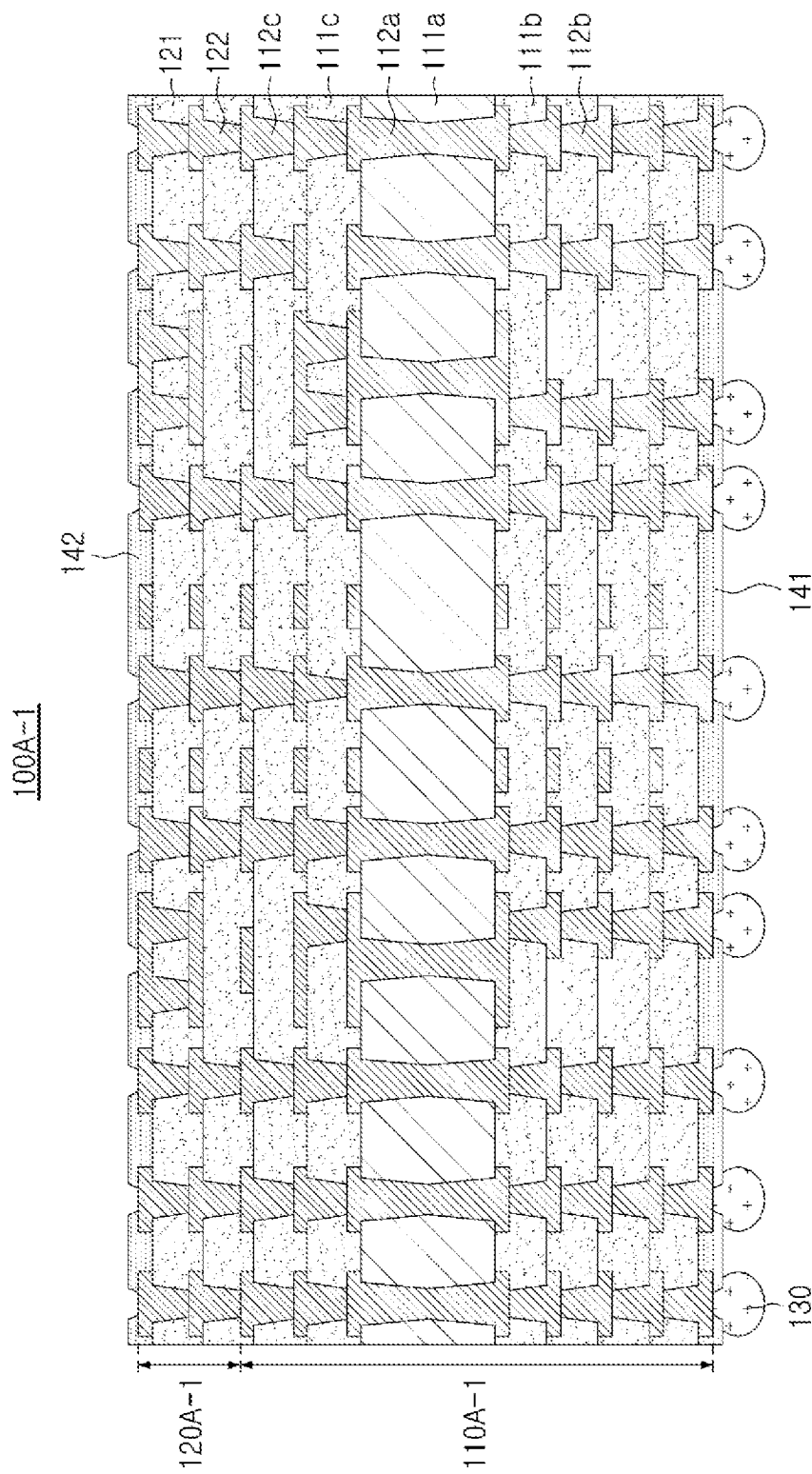
FIG. 10 is a schematic cross-sectional view illustrating a package board according to an exemplary embodiment in the present disclosure.

FIG. 10 is a schematic cross-sectional view illustrating a package board according to an exemplary embodiment in the present disclosure.

Referring to FIG. 10, a package board 100A-1 according to an exemplary embodiment may include a wiring layer 110A-1 and a BEOL layer 120A-1 disposed on the wiring layer 110A-1. The wiring layer 110A-1 may include a core insulating layer 111a, core metal layers 112a formed in the core insulating layer 111a, first and second build-up insulating layers 111b and 111c built up on opposite surfaces of the core insulating layer 111a, respectively, and first and second build-up metal layers 112b and 112c formed on the first and second build-up insulating layers 111b and 111c, respectively. The BEOL layer 120A-1 may include insulating layers 121 and metal layers 122 formed in the insulating layers 121. If necessary, the package board 100A-1 may further include a first passivation layer 141 disposed on the wiring layer 110A-1 and having a plurality of openings each exposing at least portions of the lowermost first build-up metal layer 112b, a second passivation layer 142 disposed on the BEOL layer 120A-1 and having a plurality of openings each exposing at least portions of the uppermost metal layer 122, and/or a plurality of electrical connection conductors 130 each formed on the plurality of openings of the first passivation layer 141.

The core insulating layer 111a may function as a core layer of the package board 100A-1, and may provide rigidity. A material of the core insulating layer 111a is not particularly limited. For example, an insulating material may be used as the material of the core insulating layer 111a. In this case, the insulating material may be a thermosetting resin such as an epoxy resin, a thermoplastic resin such as a polyimide resin, a resin in which the thermosetting resin or the thermoplastic resin is mixed with an inorganic filler such as silica or is impregnated together with an inorganic filler in a core material such as a glass fiber (or a glass cloth or a glass fabric), for example, prepreg, Ajinomoto Build-up Film (ABF), FR-4, Bismaleimide Triazine (BT), or the like, but is not limited thereto. The core insulating layer 111a may be introduced through a copper clad laminate (CCL) or the like, but is not limited thereto. The core insulating layer 111a may be thicker than each of the first and second build-up insulating layers 111b and 111c.

The first and second build-up insulating layers 111b and 111c may be introduced onto the opposite surfaces of the core insulating layer 111a for build-up, respectively. A material of each of the first and second build-up insulating layers 111b and 111c is also not particularly limited. For example, an insulating material may be used as the material of each of the first and second build-up insulating layers 111b and 111c. In this case, the insulating material may be a thermosetting resin such as an epoxy resin, a thermoplastic resin such as a polyimide resin, a resin in which the thermosetting resin or the thermoplastic resin is mixed with an inorganic filler such as silica or is impregnated in a core material of an inorganic filler, for example, prepreg, ABF, FR-4, BT, or the like, but is not limited thereto. The first and second build-up insulating layers 111b and 111c may be introduced through resin coated copper (RCC) or the like, but are not limited thereto. The numbers of first and second build-up insulating layers 111b and 111c are not particularly limited, and may be variously modified depending on a design. Boundaries between the first and second build-up insulating layers 111b and 111c may be apparent or the first and second build-up insulating layers 111b and 111c may be integrated with each other so that boundaries therebetween are not apparent.

The core metal layers 112a may perform various functions depending on designs of their corresponding layers. For example, the core metal layers 112a may include wirings for ground transmission, wirings for power transmission, wirings for signal transmission, and the like. The wirings for signal transmission may include various signals other than the wirings for ground transmission and the wirings for power transmission, for example, a data signal and the like. Each of these wirings may include a trace pattern, a via pattern, and the like. The trace pattern may include a pad pattern and the like. The core metal layer 112a may include a conductive material, specifically, a metal material, such as copper (Cu), aluminum (Al), silver (Ag), tin (Sn), gold (Au), nickel (Ni), lead (Pb), titanium (Ti), or alloys thereof. The core metal layer 112a may include an electroless plating layer (or chemical copper) and an electroplating layer (or electrolytic copper). The via pattern of the core metal layer 112a may be in the form of a through via, and may have an hourglass shape, a cylindrical shape, or the like, in cross section, but is not limited thereto.

The first and second build-up metal layers 112b and 112c may perform various functions depending on designs of their corresponding layers. For example, the first and second build-up metal layers 112b and 112c may include wirings for ground transmission, wirings for power transmission, wirings for signal transmission, and the like. The wirings for signal transmission may include various signals other than the wirings for ground transmission and the wirings for power transmission, for example, a data signal and the like. Each of these wirings may include a trace pattern, a via pattern, and the like. The trace pattern may include a pad pattern and the like. The first and second build-up metal layers 112b and 112c may include a conductive material, specifically, a metal material, such as copper (Cu), aluminum (Al), silver (Ag), tin (Sn), gold (Au), nickel (Ni), lead (Pb), titanium (Ti), or alloys thereof. Each of the first and second build-up metal layers 112b and 112c may include an electroless plating layer (chemical copper) and an electroplating layer (or electrolytic copper). The via pattern of the first and second build-up metal layers 112b and 112c may have a shape in which it is tapered downward or upward on cross section, but is not limited thereto.

The insulating layers 121 may be disposed on the second build-up insulating layer 111c and may be built up in the same manner as the second build-up insulating layer 111c. A material of each of the insulating layers 121 is also not particularly limited. For example, an insulating material may be used as the material of each of the insulating layers 121. In this case, the insulating material may be a thermosetting resin such as an epoxy resin, a thermoplastic resin such as a polyimide resin, a resin in which the thermosetting resin or the thermoplastic resin is mixed with an inorganic filler such as silica or is impregnated in a core material of an inorganic filler, for example, prepreg, ABF, FR-4, BT, or the like, but is not limited thereto. The insulating layers 121 may also be introduced through RCC or the like, but is not limited thereto. The number of insulating layers 121 is not particularly limited, and may be variously modified depending on a design. A boundary between the insulating layers 121 may be apparent, or the insulating layers 121 may be integrated with each other so that a boundary therebetween is not apparent.

The metal layers 122 may mainly include wirings for power transmission. However, the metal layers 122 may further include some wirings for signal transmission and/or some wirings for ground transmission, if necessary. Here, the wiring for power transmission may be a wiring for transmitting power to the semiconductor chip. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping pads or the like of the respective layers. Each of these wirings may include a trace pattern, a via pattern, and the like. The trace pattern may include a pad pattern and the like. Each of the metal layers 122 may include a conductive material, specifically, a metal material, such as copper (Cu), aluminum (Al), silver (Ag), tin (Sn), gold (Au), nickel (Ni), lead (Pb), titanium (Ti), or alloys thereof. Each of the metal layers 122 may include an electroless plating layer (or chemical copper) and an electroplating layer (or electrolytic copper). The via pattern of the metal layer 122 may have a shape in which it is tapered downward on cross section, but is not limited thereto.

The first and second passivation layers 141 and 142 may be disposed at both outermost sides of the package board 100A-1, respectively, to protect internal components. A material of each of the first and second passivation layers 141 and 142 is not particularly limited. For example, an insulating material may be used as the material of each of the first and second passivation layers 141 and 142. In this case, the insulating material may be a solder resist. However, a material of each of the first and second passivation layers 141 and 142 is not limited thereto, but may also be ABF or the like.

The plurality of electrical connection conductors 130 may externally physically and/or electrically connect the package board 100A-1. For example, the package board 100A-1 may be a ball grid array (BGA)-type board. Each of the plurality of electrical connection conductors 130 may include a low melting metal having a lower melting point than copper (Cu), such as tin (Sn) or alloys including tin (Sn). For example, each of the plurality of electrical connection conductors 130 may include a solder, but this is only an example, and a material of each of the electrical connection conductors 130 is not particularly limited thereto. The plurality of electrical connection conductors 130 may be lands, balls, pins, or the like. The plurality of electrical connection conductors 130 may be a single layer or multiple layers. When the plurality of electrical connection conductors 130 are formed as multilayer layers, the plurality of electrical connection conductors 130 may include a copper (Cu) pillar and a solder. When the plurality of electrical connection conductors 130 are formed as a single layer, the plurality of electrical connection conductors 130 may include a solder. However, this is only an example, and the plurality of electrical connection conductors 130 are not limited thereto.

As such, the package board 100A-1 according to an exemplary embodiment may be a core-type multilayer board, and may be applied to the semiconductor package 500A according to the exemplary embodiment described above when the package board 100A-1 includes the BEOL layer 120A-1 and be applied the semiconductor package 500B according to another exemplary embodiment described above when the BEOL layer 120A-1 is replaced with the wiring layer 110A-1.

Other contents, for example, the contents described in the semiconductor packages 500A, 500B, and 500C described above may be applied to the package board 100A-1 as long as there is no contradiction, and a description of overlapping contents is omitted.

Figure 11:
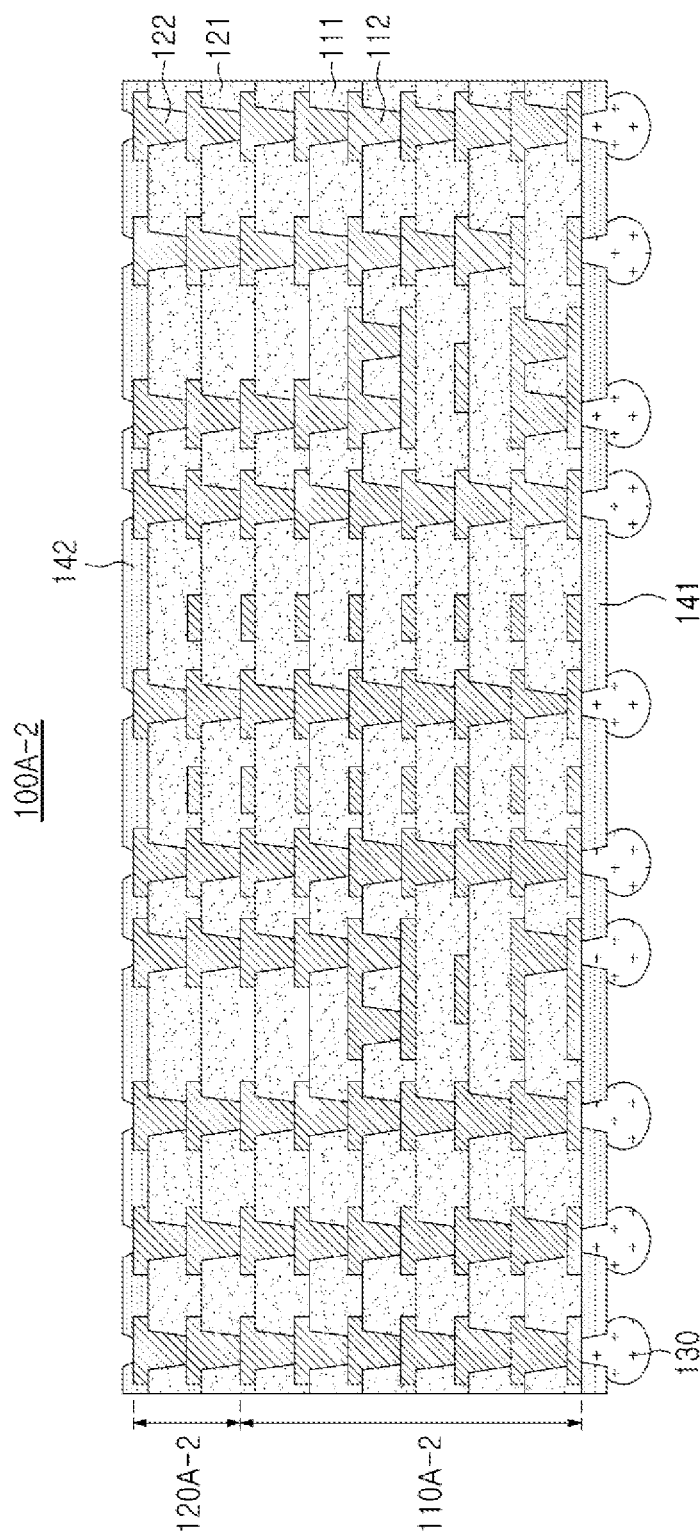
FIG. 11 is a schematic cross-sectional view illustrating a package board according to another exemplary embodiment in the present disclosure.

FIG. 11 is a schematic cross-sectional view illustrating a package board according to another exemplary embodiment in the present disclosure.

Referring to FIG. 11, a package board 100A-2 according to another exemplary embodiment may include a wiring layer 110A-2 and a BEOL layer 120A-2 disposed on the wiring layer 110A-2. The wiring layer 110A-2 may include build-up insulating layers 111 and build-up metal layers 112 formed in the build-up insulating layers 111. The BEOL layer 120A-2 may include insulating layers 121 and metal layers 122 formed in the insulating layers 121. If necessary, the package board 100A-2 may further include a first passivation layer 141 disposed on the wiring layer 110A-2 and having a plurality of openings each exposing at least portions of the lowermost build-up metal layer 112, a second passivation layer 142 disposed on the BEOL layer 120A-2 and having a plurality of openings each exposing at least portions of the uppermost metal layer 122, and/or a plurality of electrical connection conductors 130 each formed on the plurality of openings of the first passivation layer 141.

As such, the package board 100A-2 according to another exemplary embodiment may be a coreless-type multilayer board, and may be applied to the semiconductor package 500A according to the exemplary embodiment described above when the package board 100A-2 includes the BEOL layer 120A-2 and be applied the semiconductor package 500B according to another exemplary embodiment described above when the BEOL layer 120A-2 is replaced with the wiring layer 110A-2.

Other contents, for example, the contents described in the semiconductor packages 500A, 500B, and 500C described above and the package board 100A-1 described above may be applied to the package board 100A-2 as long as there is no contradiction, and a description of overlapping contents is omitted.

Figure 12:
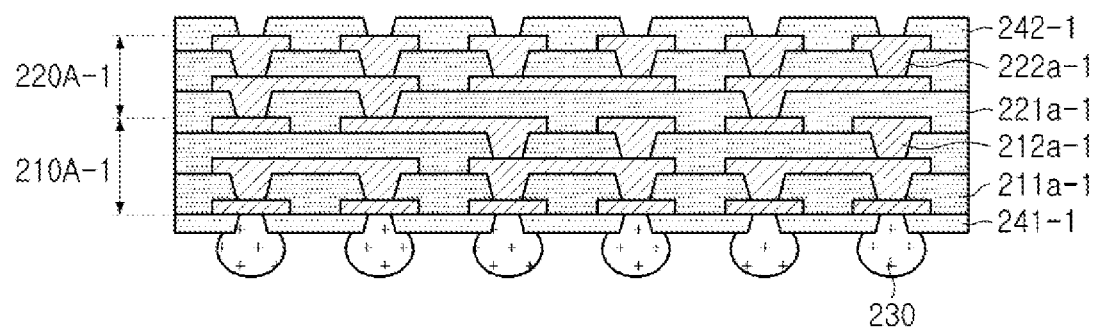
FIG. 12 is a schematic cross-sectional view illustrating an interposer board according to an exemplary embodiment in the present disclosure.

FIG. 12 is a schematic cross-sectional view illustrating an interposer board according to an exemplary embodiment in the present disclosure.

Referring to FIG. 12, an interposer board 200A-1 according to an exemplary embodiment may be an organic interposer. For example, the interposer board 200A-1 may be a coreless-type organic multilayer board. For example, the interposer board 200A-1 according to an exemplary embodiment may include a wiring layer 210A-1 and a BEOL layer 220A-1 disposed on the wiring layer 210A-1. The wiring layer 210A-1 may include a plurality of insulating layers 211a-1 and a plurality of metal layers 212a-1. The BEOL layer 220A-1 may include one or more insulating layers 221a-1 and one or more metal layers 222a-1. The interposer board 200A-1 may further include first and second passivation layers 241-1 and 242-1 and a plurality of electrical connection conductors 230, if necessary.

Each of the insulating layers 211a-1 and 221a-1 may include an organic insulating material. The organic insulating material may be a thermosetting resin such as an epoxy resin, a thermoplastic resin such as a polyimide resin, a resin in which the thermosetting resin or the thermoplastic resin is mixed with an inorganic filler such as silica or is impregnated in a core material of an inorganic filler, for example, prepreg, ABF, FR-4, BT, or the like, but is not limited thereto. The numbers of insulating layers 211a-1 and 221a-2 are not particularly limited, and may be variously modified depending on a design. Boundaries between the insulating layers 211a-1 and 221a-2 may be apparent, or the insulating layers 211a-1 and 221a-2 may be integrated with each other so that boundaries therebetween are not apparent.

The metal layers 212a-1 may include wirings for power transmission, wirings for signal transmission, wirings for ground transmission, and the like. The wirings for signal transmission may include various signals other than the wirings for ground transmission and the wirings for power transmission, for example, a data signal and the like. Each of these wirings may include a trace pattern, a via pattern, and the like. The trace pattern may include a pad pattern and the like. Each of the metal layers 212a-1 may include a conductive material, specifically, a metal material, such as copper (Cu), aluminum (Al), silver (Ag), tin (Sn), gold (Au), nickel (Ni), lead (Pb), titanium (Ti), or alloys thereof. Each of the metal layers 212a-1 may include an electroless plating layer (or chemical copper) and an electroplating layer (or electrolytic copper). The via pattern of the metal layer 212a-1 may have a shape in which it is tapered downward on cross section, but is not limited thereto.

The metal layers 222a-1 may mainly include wirings for power transmission. However, the metal layers 222a-1 may further include some wirings for signal transmission and/or some wirings for ground transmission, if necessary. Here, the wiring for power transmission may be a wiring for transmitting power to the semiconductor chip. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping pads or the like of the respective layers. Each of these wirings may include a trace pattern, a via pattern, and the like. The trace pattern may include a pad pattern and the like. Each of the metal layers 222a-1 may include a conductive material, specifically, a metal material, such as copper (Cu), aluminum (Al), silver (Ag), tin (Sn), gold (Au), nickel (Ni), lead (Pb), titanium (Ti), or alloys thereof. Each of the metal layers 212a-1 may include an electroless plating layer (or chemical copper) and an electroplating layer (or electrolytic copper). The via pattern of the metal layer 222a-1 may have a shape in which it is tapered downward on cross section, but is not limited thereto.

The first and second passivation layers 241-1 and 242-2 may be disposed at both outermost sides of the interposer board 200A-1, respectively, to protect internal components. A material of each of the first and second passivation layers 241-1 and 242-2 is not particularly limited. For example, an insulating material may be used as the material of each of the first and second passivation layers 241-1 and 242-2. In this case, the insulating material may be a solder resist. However, a material of each of the first and second passivation layers 241-1 and 242-2 is not limited thereto, but may also be ABF or the like.

The plurality of electrical connection conductors 230 may externally physically and/or electrically connect the interposer board 200A-1. For example, the interposer board 200A-1 may be a BGA-type board. Each of the plurality of electrical connection conductors 230 may include a low melting metal having a lower melting point than copper (Cu), such as tin (Sn) or alloys including tin (Sn). For example, each of the plurality of electrical connection conductors 230 may include a solder, but this is only an example, and a material of each of the electrical connection conductors 230 is not particularly limited thereto. The plurality of electrical connection conductors 230 may be lands, balls, pins, or the like. The plurality of electrical connection conductors 230 may be a single layer or multiple layers. When the plurality of electrical connection conductors 230 are formed as multilayer layers, the plurality of electrical connection conductors 230 may include a copper (Cu) pillar and a solder. When the plurality of electrical connection conductors 230 are formed as a single layer, the plurality of electrical connection conductors 230 may include a solder. However, this is only an example, and the plurality of electrical connection conductors 230 are not limited thereto.

Other contents, for example, the contents described in the semiconductor packages 500A, 500B, and 500C described above may be applied to the interposer board 200A-1 as long as there is no contradiction, and a description of overlapping contents is omitted.

Figure 13:
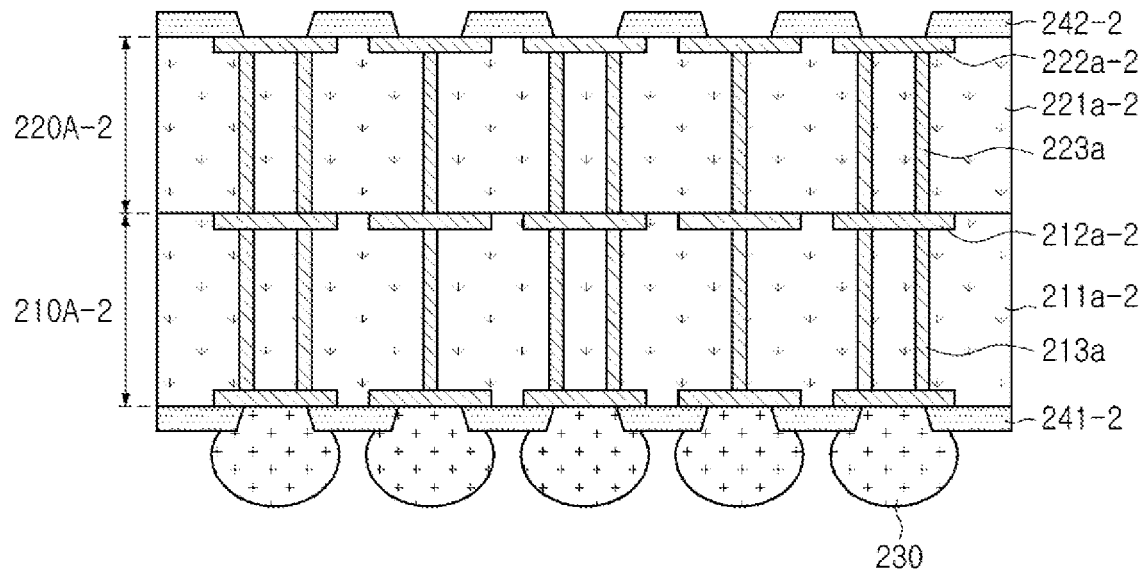
FIG. 13 is a schematic cross-sectional view illustrating an interposer board according to another exemplary embodiment in the present disclosure.

FIG. 13 is a schematic cross-sectional view illustrating an interposer board according to another exemplary embodiment in the present disclosure.

Referring to FIG. 13, an interposer board 200A-2 according to another exemplary embodiment may be an inorganic interposer. For example, the interposer board 200A-2 may be a silicon interposer. For example, the interposer board 200A-2 according to another exemplary embodiment may include a wiring layer 210A-2 and a BEOL layer 220A-2 disposed on the wiring layer 210A-2. The wiring layer 210A-2 may include one or more insulating layers 211a-2 and one or more metal layers 212a-2. The BEOL layer 220A-2 may include one or more insulating layers 221a-2 and one or more metal layers 222a-2. The interposer board 200A-2 may further include first and second passivation layers 241-2 and 242-2 and a plurality of electrical connection conductors 230, if necessary.

The insulating layers 211a-2 and 221a-2 may provide a body of the interposer board 200A-2. Each of the insulating layers 211a-2 and 221a-2 may include an insulating material. In this case, the insulating material may include silicon, more specifically, silicon dioxide. In this case, the interposer board 200A-2 may be formed by a semiconductor wafer process, and thus, the metal layers 212a-2 and 222a-2 may be easily designed at a high density. However, a material of each of the insulating layers 211a-2 and 221a-2 is not limited thereto, and may be other semiconductor materials. The numbers of insulating layers 211a-2 and 211a-2 are not particularly limited, and may be variously modified depending on a design. When the insulating layers 211a-2 and 221a-2 are multilayer, boundaries between the insulating layers 211a-2 and 221a-2 may be apparent or may not be apparent.

The metal layers 212a-2 may include wirings for signal transmission, wirings for power transmission, wirings for ground transmission, and the like. The wirings for signal transmission may include various signals other than the wirings for ground transmission and the wirings for power transmission, for example, a data signal and the like. Each of the metal layers 212a-2 may include a conductive material, specifically, a metal material, such as copper (Cu), aluminum (Al), silver (Ag), tin (Sn), gold (Au), nickel (Ni), lead (Pb), titanium (Ti), or alloys thereof. Each of the metal layers 212a-2 may be formed by a deposition process such as chemical vapor deposition (CVD), but is not limited thereto. The number of metal layers 212a-2 is also not particularly limited, and may be modified depending on a design. The metal layers 212a-2 may include vias 213a for interlayer electrical connection, and the vias 213a may be through silicon vias (TSVs), but are not limited thereto.

The metal layers 222a-2 may mainly include wirings for power transmission. However, the metal layers 222a-2 may further include some wirings for signal transmission and/or some wirings for ground transmission, if necessary. Here, the wiring for power transmission may be a wiring for transmitting power to the semiconductor chip 300. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping trace patterns or the like of the respective layers. Each of the metal layers 222a-2 may include a conductive material, specifically, a metal material, such as copper (Cu), aluminum (Al), silver (Ag), tin (Sn), gold (Au), nickel (Ni), lead (Pb), titanium (Ti), or alloys thereof. Each of the metal layers 222a-2 may be formed by a deposition process such as CVD, but is not limited thereto. The number of metal layers 222a-2 is also not particularly limited, and may be modified depending on a design. The metal layers 222a-2 may include vias 223a for interlayer electrical connection, and the vias 223a may be TSVs, but are not limited thereto.

The first and second passivation layers 241-2 and 242-2 may be disposed at both outermost sides of the interposer board 200A-2, respectively, to protect internal components. A material of each of the first and second passivation layers 241-2 and 242-2 is not particularly limited. For example, an insulating material may be used as the material of each of the first and second passivation layers 241-2 and 242-2. In this case, the insulating material may include an oxide film, a nitride film or the like, but is not limited thereto.

Other contents, for example, the contents described in the semiconductor packages 500A, 500B, and 500C described above and the interposer board 200A-1 described above may be applied to the interposer board 200A-2 as long as there is no contradiction, and a description of overlapping contents is omitted.

Figure 14:
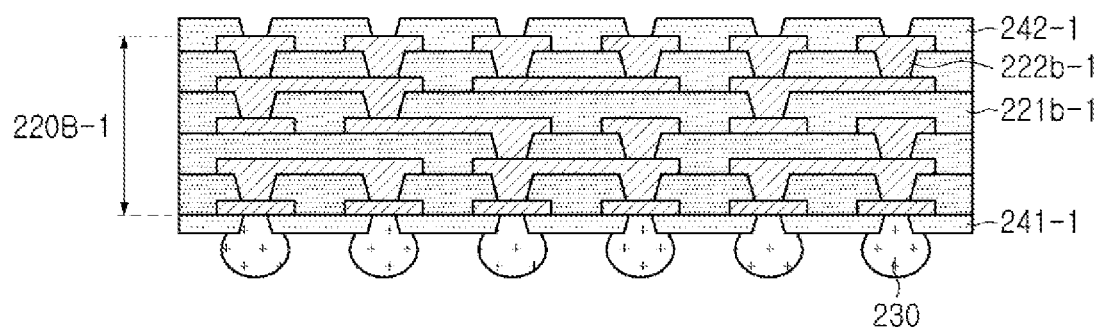
FIG. 14 is a schematic cross-sectional view illustrating an interposer board according to another exemplary embodiment in the present disclosure.

FIG. 14 is a schematic cross-sectional view illustrating an interposer board according to another exemplary embodiment in the present disclosure.

Referring to FIG. 14, an interposer board 200B-1 according to another exemplary embodiment may be an organic interposer in which the wiring layer is omitted from the interposer board 200A-1 described above and a BEOL layer 220B-1 includes a plurality of insulating layers 221b-1 and a plurality of metal layers 222b-1.

Each of the insulating layers 221b-1 may include an organic insulating material. The organic insulating material may be a thermosetting resin such as an epoxy resin, a thermoplastic resin such as a polyimide resin, a resin in which the thermosetting resin or the thermoplastic resin is mixed with an inorganic filler such as silica or is impregnated in a core material of an inorganic filler, for example, prepreg, ABF, FR-4, BT, or the like, but is not limited thereto. The number of insulating layers 221b-2 is not particularly limited, and may be variously modified depending on a design. A boundary between the insulating layers 221b-1 may be apparent, or the insulating layers 221b-1 may be integrated with each other so that a boundary therebetween is not apparent.

The metal layers 222b-1 may mainly include wirings for power transmission. However, the metal layers 222b-1 may further include some wirings for signal transmission and/or some wirings for ground transmission, if necessary. Here, the wiring for power transmission may be a wiring for transmitting power to the semiconductor chip 300. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping pads or the like of the respective layers. Each of these wirings may include a trace pattern, a via pattern, and the like. The trace pattern may include a pad pattern and the like. Each of the metal layers 222b-1 may include a conductive material, specifically, a metal material, such as copper (Cu), aluminum (Al), silver (Ag), tin (Sn), gold (Au), nickel (Ni), lead (Pb), titanium (Ti), or alloys thereof. Each of the metal layers 222b-1 may include an electroless plating layer (or chemical copper) and an electroplating layer (or electrolytic copper). The via pattern of the metal layer 222b-1 may have a shape in which it is tapered downward on cross section, but is not limited thereto.

Other contents, for example, the contents described in the semiconductor packages 500A, 500B, and 500C described above and the interposer boards 200A-1 and 200A-2 described above may be applied to the interposer board 200B-1 as long as there is no contradiction, and a description of overlapping contents is omitted.

Figure 15:
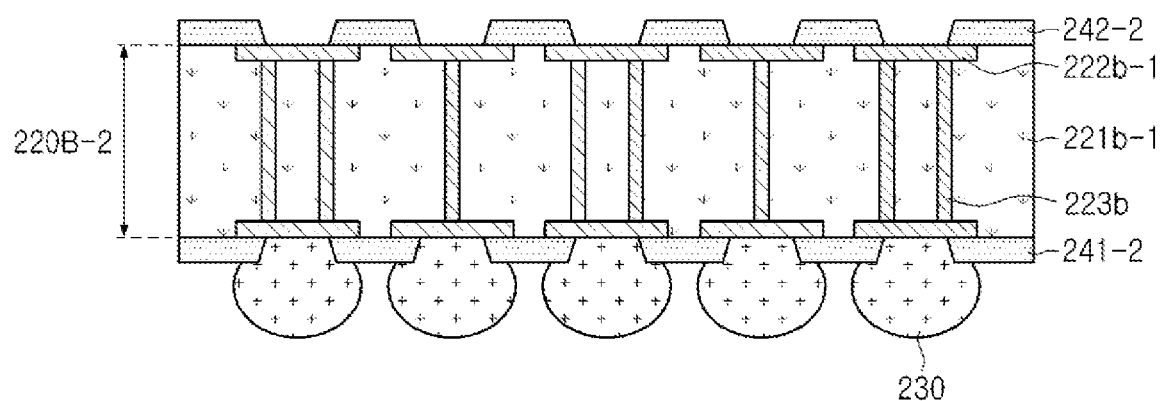
FIG. 15 is a schematic cross-sectional view illustrating an interposer board according to another exemplary embodiment in the present disclosure.

FIG. 15 is a schematic cross-sectional view illustrating an interposer board according to another exemplary embodiment in the present disclosure.

Referring to FIG. 15, an interposer board 200B-2 according to another exemplary embodiment may be a silicon interposer in which the wiring layer is omitted from the interposer board 200A-2 described above and a BEOL layer 220B-2 includes one or more insulating layers 221b-2 and one or more metal layers 222b-2.

The insulating layers 221b-2 may provide a body of the interposer board 200B-2. Each of the insulating layers 221b-2 may include an insulating material. In this case, the insulating material may include silicon, more specifically, silicon dioxide. In this case, the interposer board 200B-2 may be formed by a semiconductor wafer process, and thus, the metal layers 222b-2 may be easily designed at a high density. However, a material of each of the insulating layers 221b-2 is not limited thereto, and may be other semiconductor materials. The number of insulating layers 211b-2 is not particularly limited, and may be variously modified depending on a design. When the insulating layers 221b-2 are multilayer, a boundary between the insulating layers 221b-2 may be apparent or may not be apparent.

The metal layers 222b-2 may mainly include wirings for power transmission. However, the metal layers 222b-2 may further include some wirings for signal transmission and/or some wirings for ground transmission, if necessary. Here, the wiring for power transmission may be a wiring for transmitting power to the semiconductor chip 300. In addition, the phrase "mainly include the wirings for power transmission" may mean that a total area occupied by the wirings for power transmission is greater than a total area occupied by the wirings for signal transmission and/or the wirings for ground transmission in plan view. In the case of a plurality of layers, the sums of areas in plan view in respective layers may be compared with each other, and the areas in plan view in the respective layers may be determined with the exception of vias overlapping trace patterns or the like of the respective layers. Each of the metal layers 222b-2 may include a conductive material, specifically, a metal material, such as copper (Cu), aluminum (Al), silver (Ag), tin (Sn), gold (Au), nickel (Ni), lead (Pb), titanium (Ti), or alloys thereof. Each of the metal layers 222b-2 may be formed by a deposition process such as CVD, but is not limited thereto. The number of metal layers 222b-2 is also not particularly limited, and may be modified depending on a design. The metal layers 222b-2 may include vias 223b for interlayer electrical connection, and the vias 223b may be TSVs, but are not limited thereto.

Other contents, for example, the contents described in the semiconductor packages 500A, 500B, and 500C described above and the interposer boards 200A-1, 200A-2, and 200B-1 described above may be applied to the interposer board 200B-2 as long as there is no contradiction, and a description of overlapping contents is omitted.

As set forth above, according to an exemplary embodiment in the present disclosure, a semiconductor chip of which a process cost may be decreased, and a semiconductor package including the same may be provided.

In addition, a semiconductor chip capable of solving a cost problem due to a decrease in yield of the semiconductor chip, and a semiconductor package including the same may be provided.

While exemplary embodiments have been shown and described above, it will be apparent to those skilled in the art that modifications and variations could be made without departing from the scope of the present invention as defined by the appended claims.

What is claimed is:

1. A semiconductor package comprising:
    a semiconductor chip including a front end of line (FEOL) layer and a first back end of line (BEOL) layer disposed on the FEOL layer; and
    a printed circuit board including a wiring layer and a second BEOL layer disposed on the wiring layer,
    wherein the semiconductor chip is mounted on the printed circuit board so that the first and second BEOL layers are connected to each other,
    the second BEOL layer includes a wiring for power transmission, and
    the first BEOL layer is between the FEOL layer and the second BEOL layer.

2. The semiconductor package of claim 1, wherein the wiring for power transmission is a wiring for transmitting power to the semiconductor chip.

3. The semiconductor package of claim 1, wherein the first BEOL layer is disposed adjacent to a bottom side of the semiconductor chip, and
    the second BEOL layer is disposed adjacent to a top side of the printed circuit board.

4. The semiconductor package of claim 1, wherein the FEOL layer includes a first circuit unit including a plurality of first transistor elements and a second circuit unit including a plurality of second transistor elements,
    the first and second BEOL layers include first and second wiring units electrically connected to the first and second circuit units, respectively,
    the first wiring unit does not include a trace pattern for power transmission interconnecting the first and second circuit units within the first BEOL layer, and
    the second wiring unit includes a trace pattern for power transmission interconnecting the first and second circuit units within the second BEOL layer.

5. The semiconductor package of claim 4, wherein the first wiring unit does not include a trace pattern for power transmission interconnecting at least two of the plurality of first transistor elements and a trace pattern for power transmission interconnecting at least two of the second transistor elements within the first BEOL layer, and
    the second wiring unit includes a trace pattern for power transmission interconnecting at least two of the plurality of first transistor elements and a trace pattern for power transmission interconnecting at least two of the second transistor elements within the second BEOL layer.

6. The semiconductor package of claim 1, wherein the first BEOL layer includes a plurality of metal layers, and a first metal layer closest to the FEOL layer among the plurality of metal layers includes a trace pattern for signal transmission, but does not include a trace pattern for power transmission.

7. The semiconductor package of claim 6, wherein the trace pattern for power transmission that is not included in the first metal layer includes at least one of a trace pattern for a positive supply voltage (VDD) and a trace pattern for a negative supply voltage (VSS).

8. The semiconductor package of claim 6, wherein the first metal layer includes a via pattern for power transmission electrically connected to the wiring for power transmission of the second BEOL layer.

9. The semiconductor package of claim 8, wherein the via pattern for power transmission that is included in the first metal layer includes at least one of a via pattern for a positive supply voltage (VDD) and a via pattern for a negative supply voltage (VSS).

10. The semiconductor package of claim 1, wherein the second BEOL layer includes one or more insulating layers and one or more metal layers, and
    the one or more insulating layers include an organic insulating material.

11. The semiconductor package of claim 1, wherein the semiconductor chip further includes a redistribution layer disposed on the first BEOL layer, and
    the first and second BEOL layers are connected to each other through the redistribution layer.

12. The semiconductor package of claim 1, further comprising:
    a plurality of connection conductors disposed between the printed circuit board and the semiconductor chip and connecting the printed circuit board and the semiconductor chip to each other; and
    a plurality of electrical connection conductors disposed on the other surface of the printed circuit board opposing one surface of the printed circuit board on which the semiconductor chip is mounted and connected to the printed circuit board,
    wherein each of the plurality of connection conductors includes a solder bump, and
    each of the plurality of electrical connection conductors includes a solder ball.

13. The semiconductor package of claim 1, wherein silicon is not disposed between the first and second BEOL layers.

14. The semiconductor package of claim 13, wherein a wiring pitch of the second BEOL layer is greater than a wiring pitch of the first BEOL layer.

15. The semiconductor package of claim 1, wherein the first BEOL layer is spaced apart from the second BEOL layer.

16. A semiconductor package comprising:
    a semiconductor chip including a first BEOL layer, and a FEOL layer;
    an interposer board including a second BEOL layer; and
    a package board including a wiring layer,
    wherein the semiconductor chip is mounted on the interposer board,
    the interposer board is mounted on the package board,
    the first and second BEOL layers are connected to each other,
    the second BEOL layer includes a wiring for power transmission, and
    the first BEOL layer is between the FEOL layer and the second BEOL layer.

17. The semiconductor package of claim 16, wherein the interposer board is an organic interposer or an inorganic interposer,
the organic interposer includes a coreless-type board, and the inorganic interposer includes a silicon interposer.

18. The semiconductor package of claim 16, further comprising:
a plurality of connection conductors disposed between the semiconductor chip and the interposer board and connecting the semiconductor chip and the interposer board to each other; and
a plurality of first electrical connection conductors disposed between the interposer board and the package board and connecting the interposer board and the package board to each other; and
a plurality of second electrical connection conductors disposed on the other surface of the package board opposing one surface of the package board on which the interposer board is disposed and connected to the package board,
wherein each of the plurality of connection conductors includes a solder bump, and
each of the plurality of first and second electrical connection conductors includes a solder ball.

19. A semiconductor chip comprising:
a FEOL layer including a plurality of circuit units each including a plurality of transistor elements; and
a BEOL layer disposed on the FEOL layer and including a wiring unit electrically connected to the plurality of circuit units,
wherein the wiring unit does not include a trace pattern for power transmission interconnecting at least two of the plurality of circuit units.

20. The semiconductor chip of claim 19, wherein the wiring unit does not include a trace pattern for power transmission interconnecting at least two of the plurality of transistor elements of at least one of the plurality of circuit units.

21. A semiconductor package comprising:
a semiconductor chip including a FEOL layer and a first BEOL layer disposed on the FEOL layer, the FEOL layer including a first circuit unit including a plurality of first transistor elements and a second circuit unit including a plurality of second transistor elements, and the first BEOL layer including a first wiring unit electrically connected to the first and second circuit units; and
a printed circuit board including a second BEOL layer including a second wiring unit electrically connected to the first wiring unit,
wherein the semiconductor chip is mounted on the printed circuit board,
the first wiring unit does not include a trace pattern for power transmission interconnecting the first and second circuit units within the first BEOL layer,
the second wiring unit includes a trace pattern for power transmission interconnecting the first and second circuit units within the second BEOL layer,
the first BEOL layer is between the FEOL layer and the second BEOL layer.

22. The semiconductor package of claim 21, wherein the first wiring unit does not include a trace pattern for power transmission interconnecting at least two of the plurality of first transistor elements within the first BEOL layer, and
the second wiring unit includes a trace pattern for power transmission interconnecting at least two of the plurality of first transistor elements within the second BEOL layer.

23. The semiconductor package of claim 21, wherein the first wiring unit does not include a trace pattern for power transmission interconnecting at least two of the plurality of second transistor elements within the first BEOL layer, and
the second wiring unit includes a trace pattern for power transmission interconnecting at least two of the plurality of second transistor elements within the second BEOL layer.

* * * * *